United States Patent
Chang et al.

(10) Patent No.: US 8,835,927 B2
(45) Date of Patent: Sep. 16, 2014

(54) DISPLAY SUBSTRATE

(71) Applicant: Samsung Display Co., Ltd., Yongin (KR)

(72) Inventors: Jong-Woong Chang, Asan-si (KR); Ho-Kyoon Kwon, Seoul (KR); Kee-Byem Kim, Asan-si (KR); Yun-Soo Kim, Asan-si (KR); Dae-Ho Song, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 143 days.

(21) Appl. No.: 13/676,631

(22) Filed: Nov. 14, 2012

(65) Prior Publication Data

US 2013/0248869 A1    Sep. 26, 2013

(30) Foreign Application Priority Data

Mar. 20, 2012  (KR) .................. 10-2012-0028105

(51) Int. Cl.
*H01L 33/08* (2010.01)
*H01L 21/77* (2006.01)

(52) U.S. Cl.
CPC ............... *H01L 33/08* (2013.01); *H01L 21/77* (2013.01)
USPC .. 257/59; 257/72; 257/E21.414; 257/E21.703

(58) Field of Classification Search
USPC ................. 257/59, 72, E21.414, E21.703
See application file for complete search history.

(56) References Cited

U.S. PATENT DOCUMENTS

| 7,483,107 | B2 | 1/2009 | Lee | |
|---|---|---|---|---|
| 2006/0028589 | A1* | 2/2006 | Um et al. .................. | 349/33 |
| 2008/0042963 | A1* | 2/2008 | Fujita ........................ | 345/98 |

FOREIGN PATENT DOCUMENTS

KR    10-2006-0078246 A    7/2006

* cited by examiner

*Primary Examiner* — Cathy N Lam
(74) *Attorney, Agent, or Firm* — Innovation Counsel LLP

(57) ABSTRACT

A display substrate includes a gate line extended in one direction of a base substrate, a first data line extended in a direction crossing the gate line, a transverse storage line extended in the extending direction of the gate line and crossing the first data line, a longitudinal storage line extended in the extending direction of the first data line and crossing the transverse storage line, a portion of an overlapping area between the longitudinal storage line and the transverse storage line is exposed in a contact part region having an opening partially exposing the transverse storage line. A contact electrode covers the contact part opening and makes electrical contact with each of the transverse storage line and the longitudinal storage line.

20 Claims, 17 Drawing Sheets

DISPLAY SUBSTRATE

This application claims priority under 35 U.S.C. §119 to Korean Patent Application No. 10-2012-0028105, filed on Mar. 20, 2012 and all the benefits accruing therefrom under 35 U.S.C. §119, where the contents of said application are incorporated herein in their entirety by reference.

BACKGROUND

1. Field of Disclosure

Exemplary embodiments of the present invention relate to a display substrate. More particularly, exemplary embodiments of the present invention relate to a display substrate minimizing an extent of a periphery area of a display area displaying image with decline of display quality.

2. Description of Related Technology

Liquid Crystal Displays (LCD) generally include so-called, liquid crystal capacitors ($C_{LC}$) formed by the counterfacing areas of respective pixel-electrodes (PE's) with corresponding portions of a common electrode where a liquid crystal material is interposed therebetween and defines a dielectric layer of the corresponding liquid crystal capacitor ($C_{LC}$). However, the liquid crystal capacitor ($C_{LC}$) typically does not have sufficient capacitance to store an image defining charge for a full frame period (or for another such time period until the pixel is next refreshed with new charge) and therefore it is conventional to include a so-called, storage capacitor ($C_{ST}$) for each pixel or pixel-electrode for assisting in the storage of a desired, image defining charge for the desired length of time.

Generally, a method for forming the at least one storage capacitor ($C_{ST}$) of each pixel unit includes the use of an independent wiring structure and/or the use of a previously-formed gate conductor layer. In the case of using the previously-formed gate conductor layer, the capacitance (and breakdown voltage) of the storage capacitor typically depends on a thickness of a relatively thin gate insulation layer. Therefore, the independent wiring approach is mainly used so that a breakdown voltage of the formed storage capacitor is desirably large enough to handle voltages that may be applied across the storage capacitor. One of the applied voltages typically comes from a source node disposed far away from the pixel unit. For example, in the conventional independent wiring approach, a storage voltage delivering line may be used for applying a common voltage (Vcom, as an example of an applied plate voltage) to one plate of the storage capacitor for thereby defining a charge to be stored by the storage capacitor for a predetermined retention time of the storage capacitor.

The storage voltage delivering line (also often referred to more simply as the "storage line") has a finite conductivity and thus behaves as part of an RC delay network that undesirably slows the delivery of the desired plate voltage (e.g., Vcom) to the storage capacitor. Since, conventionally, all the storage lines are disposed to extend over their respective pixel units according to just one direction and conventionally, all these same-way extending storage lines have the desired plate voltage (e.g., Vcom) applied thereto from a centralized driving part and through a common voltage wiring, the RC delay time for applying desired plate voltage (e.g., Vcom) to the individual pixel units can vary as a function of several factors, including storage line width and distance of transmittal of the desired plate voltage (e.g., Vcom) from its source node(s).

Typically, the wiring for applying the desired plate voltage (e.g., Vcom) to the storage lines is disposed on a periphery area (PA) of the display panel (where the periphery area surrounds a display area (DA) of the display panel). On the other hand, some of the pixel units of the display area (DA) are formed deep in the interior of the display area (DA) and thus relatively far away peripheral voltage delivering wirings of the plate voltage (e.g., Vcom) applying parts of the circuit. Accordingly, when a storage capacitors driving part is switched for applying a then desired plate voltage (e.g., Vcom) to the storage capacitors, the RC delay characteristics of the storage lines comes in to play and the actual plate voltage ($V_{P\_actual}$) applied to the corresponding plates (e.g., storage electrodes) of the more interior pixel units is dropped, so that a display quality may be declined.

One approach to solving this problem is to have the plate voltage (e.g., Vcom) delivering wiring designed with a predetermined minimum width so that a corresponding RC factor is kept below a predetermined maximum. However, when a width of the plate voltage (e.g., Vcom) delivering wiring is increased, a ratio of the display area versus the overall panel area (DA/(DA+PA)) is undesirably decreased.

Also, when a circuit of the driving part for the plate voltage (e.g., Vcom) delivering wiring is integrated in the periphery area (PA), the periphery area (PA) needs to be extended to accommodate that driving part and once again, the ratio of the display area versus the overall panel area (DA/(DA+PA)) is undesirably decreased.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a display substrate designed to minimize or substantially reduce an efficiency representing ratio Reff of the display area (DA) versus the overall panel area (DA+PA), the ratio being expressed as Reff=(DA/(DA+PA)), so as to thereby make more efficient use of the limited surface area of the display substrate. The present disclosure of invention also provides a method for preventing or reducing undesired decline of display quality due to RC delay characteristics of the plate voltage (e.g., Vcom) delivering wiring.

In an exemplary display substrate according to the present disclosure of invention, a display substrate includes a gate line, a first data line, a transverse storage line, a longitudinal storage line and a contact electrode. The gate line is extended in one direction on a base substrate. The first data line is extended in a direction crossing the gate line. The transverse storage line is extended in a direction substantially parallel with the gate line and extended in a direction crossing the first data line. The longitudinal storage line is extended in the extending direction of the first data line and extended in a direction crossing the transverse storage line. A portion of an overlapping (cross-over) area between the longitudinal storage line and the transverse storage line is exposed by way of an opening of a contact part, the opening partially exposing the transverse storage line. The contact electrode covers the opening of the contact part and makes electrical contact with each of the transverse storage line and the longitudinal storage lines.

In the exemplary embodiment, a sidewall surface of the longitudinal storage line may be exposed and the contact electrode may contact with the top surface of the transverse and the longitudinal storage lines and also with the sidewall surface of the longitudinal storage line so that a better short-circuiting connection is made at the corresponding contact part.

In the exemplary embodiment, the display substrate may further include a first insulation layer and a second insulation layer. The first insulation layer insulates the transverse storage line and the longitudinal storage line and the opening of the contact part exposes a surface of the transverse storage line. The second insulation layer partially covers the longitudinal storage line formed on the first insulation layer and the opening of the contact part exposes a top surface and sidewall surface of the transverse and the longitudinal storage line exposed by the first insulation layer. At this time, the contact part may be formed on the first insulation layer and the second insulation layer and made of a material same as that used for forming pixel-electrodes of the device.

In the exemplary embodiment, the display substrate may further include a second data line, a first pixel electrode and a second pixel electrode. The second data line is disposed spaced apart and sequentially successive to the first data line. The first pixel electrode is disposed between (sandwiched between) the first data line and the second data line and is connected to the first data line. The second pixel electrode is disposed adjacent to the first pixel electrode, also sandwiched between the first data line and the second data line and is connected to the second data line. At this time, the longitudinal storage line is formed to extend between the first data line and the second data line.

In the exemplary embodiment, the display substrate may have a data lines driving part disposed on a periphery area of a display area having the gate line and the first data line. The display substrate may further comprise a first common voltage wiring connected to the data lines driving part and also to one end of the longitudinal storage line.

In the exemplary embodiment, the first common voltage wiring may be disposed on the periphery area between the data driving part and the display area. The data driving part is configured to transmit a data driving signal to the first data line.

In the exemplary embodiment, the display substrate may be connected to another end, and may further include a second common voltage wiring disposed to face the first common voltage wiring.

In the exemplary embodiment, the display substrate may further include a third common voltage wiring and a fourth common voltage wiring. The third common voltage wiring is connected to the first common in a periphery area of the display area having the gate line and the first data line and extended in an extending direction of the longitudinal storage line and connected to one end of the transverse storage line. The fourth common voltage wiring is connected to the first common voltage wiring and extended in an extending direction of the longitudinal storage line and connected to another end of the transverse storage line to face the third common voltage wiring.

In the exemplary embodiment, the third common voltage wiring may be disposed in the periphery area between a gate lines driving part and the display area. The gate lines driving part is configured to transmit a gate driving signal to the gate line.

In the exemplary embodiment, the first common voltage wiring may be included in a same metallization layer as that of the gate line and of the transverse storage line. The third and fourth common voltage wirings may be included in a same metallization layer as that of the first data line and of the longitudinal storage line. The third and fourth common voltage wirings may be respectively contacted with the first common voltage wiring in an overlapping (cross-over) area between the third common voltage wiring and the first common voltage wiring and in an overlapping area between the fourth common voltage wiring and the first common voltage.

In the exemplary embodiment, the display substrate may further include a pixel electrode connected to the gate line and the first data line. The pixel electrode includes a first sub electrode and a second sub electrode. The second sub electrode is formed on the first sub electrode to overlap with the first sub electrode and includes a plurality of slit electrode.

In another exemplary display substrate according to the present invention, a display substrate includes a gate line, a first data line and a second data line, a longitudinal storage line and a first common voltage wiring. The gate line is formed on a display area of a base substrate. The first data line and a second data line cross the gate line in the display area and spaced apart from each other. The longitudinal storage line is disposed between the first and second data lines and crossing the gate line. The first common voltage wiring is extended in an extending direction of the gate line and is connected to one end of the longitudinal storage line to include a first common voltage wiring formed on a periphery area of the display area.

In the exemplary embodiment, the display substrate may further include a first pixel electrode and a second pixel electrode. The first pixel electrode is connected to the first data line and is disposed between the first and second data lines. The second pixel electrode is connected to the second data line and is disposed adjacent to the first pixel electrode between the first and second data lines.

In the exemplary embodiment, the display substrate may further include a light blocking electrode and a contact electrode. The light blocking electrode extends along an extending direction of the longitudinal storage line to overlap the longitudinal storage line and is disposed on a separation area of the first and second pixel electrodes. A portion of an area in which the light blocking electrode crosses the longitudinal storage line is exposed through a contact part partially exposing the longitudinal storage line. The contact electrode covers the contact part to contact each of the longitudinal storage line and the light blocking electrode.

In the exemplary embodiment, the display substrate may further include a data driving part. The data driving part is connected to the first and second data lines to transmit a data driving signal. The first common voltage wiring may be disposed on the periphery area between the data driving part and the display area.

In the exemplary embodiment, the display substrate may be connected to another end of the longitudinal storage line and may further include a second common voltage wiring disposed facing the first common voltage wiring.

In the exemplary embodiment, the display substrate may further include a transverse storage line, a third common voltage wiring and a fourth common voltage wiring. The transverse storage line is formed on the display area and crossing the longitudinal storage line. The transverse storage line is contacted with the longitudinal storage line in a crossing area between the transverse storage line and the longitudinal storage line. The third common voltage wiring is connected to the first common voltage wiring on the periphery area and is extended along an extending direction of the longitudinal storage line and is connected to one end of the transverse storage line. The fourth common voltage wiring is connected to the first common voltage wiring and is extended along an extending direction of the longitudinal storage line and is connected to another end of the transverse storage line to face the third common voltage wiring.

In the exemplary embodiment, the display substrate may be formed on the display area to cross the first and second data lines and may further include the longitudinal storage line and is floated relative to the transverse storage line.

In still another exemplary display substrate according to the present disclosure of invention, a display substrate include a gate line, a first data line and a second data line, a longitudinal storage line and a floated transverse storage line. The gate line is formed on a display area of a base substrate. The first data line and a second data line are extended in a direction crossing the gate line on the display area and are spaced apart from each other. The longitudinal storage line is disposed between the first and second data lines and crosses the gate line. The floated transverse storage line crosses the first and second data lines and is floated with the longitudinal storage line.

In the exemplary embodiment, the display substrate may further include a light blocking electrode and a contact electrode. The light blocking electrode extends along an extending direction of the longitudinal storage line to overlap the longitudinal storage line. A portion of the light blocking electrode being exposed through a contact part through which the longitudinal storage line is partially exposed, the exposed portion of the light blocking electrode being disposed in a crossing region between the light blocking electrode and the horizontal storage line. The contact electrode covers the contact part to contact with each of the longitudinal storage line and the light blocking electrode.

According to the display substrate, a common voltage signal (which signal may include an AC component as well as a DC signal component) may be sent (propagated) to each pixel unit of the display area through a plurality of longitudinal storage lines. The plurality of the longitudinal storage lines are extended in a direction substantially same as an extending direction of data lines to be dispose between pixels of a pixel area. Therefore, since a wiring resistance applying the common voltage signal may be minimized in the entire display substrate, a ripple delay of the common voltage signal may be decreased. Therefore, a decline of display quality by a crosstalk and a flicker may be prevented. Particularly, a decline of an aperture of the display area may be minimized through the longitudinal storage lines being disposed between and shared by adjacent pixels in a structure disposed with two pixels between spaced apart but sequentially successive data lines.

Also, the longitudinal storage lines are formed, so that an extent occupied by a common voltage wiring applying the common voltage signal to the each longitudinal storage lines in a periphery area of the display area may be decreased or omitted. Therefore, an optimal extent of the periphery area may be minimized, so that eventually an effective display extent may be maximized in a same size display panel through the display extent is relatively increased with respect to an extent of the periphery area.

BRIEF DESCRIPTION OF THE DRAWINGS

The above and other features and advantages of the present disclosure of invention will become more apparent by describing in detailed exemplary embodiments thereof with reference to the accompanying drawings, in which.

DETAILED DESCRIPTION

Hereinafter, the present disclosure of invention will be explained in detail with reference to the accompanying drawings.

Figure 1:
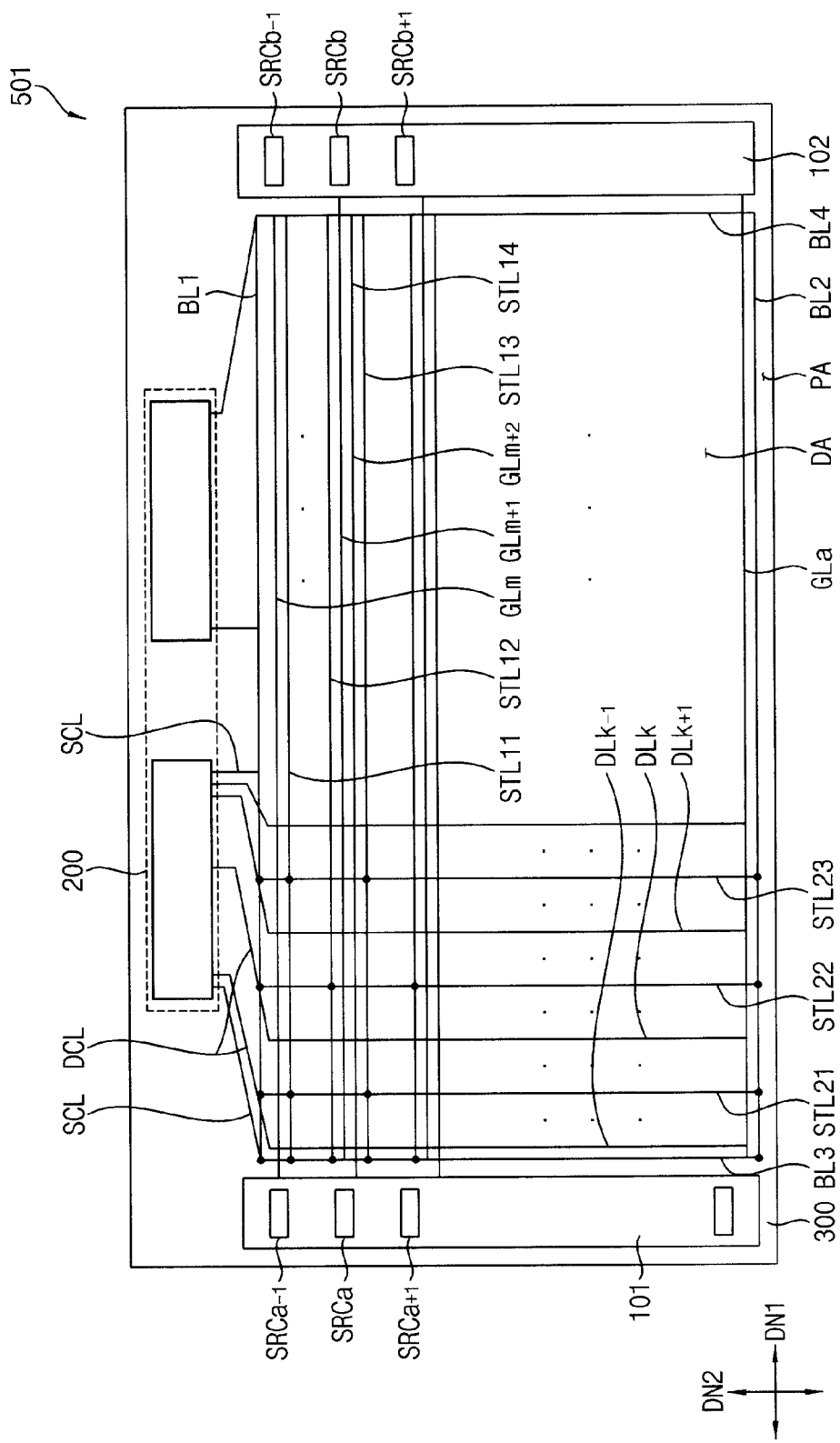
FIG. 1 is a top plan view illustrating a display panel according to an exemplary embodiment in accordance with the present disclosure.

FIG. 1 is a top plan schematic view illustrating a display panel according to an exemplary embodiment of the present disclosure of invention.

Figure 2A:
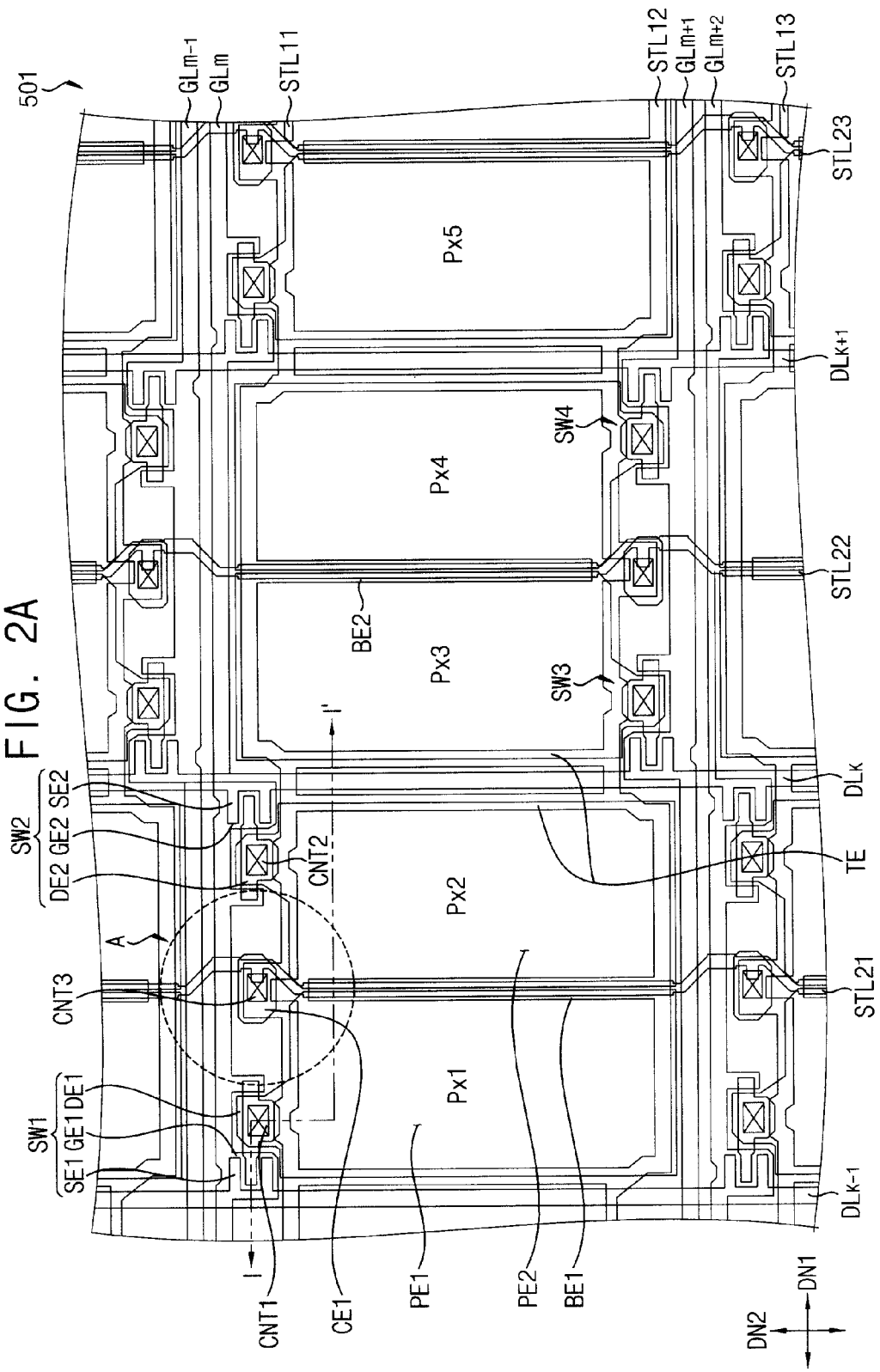
FIG. 2A is a top plan view illustrating a pixel structure of a display area of FIG. 1.

FIG. 2A is a more detailed top plan view illustrating a pixel structure of a display area of an embodiment in accordance with FIG. 1.

Referring to FIGS. 1 and 2A, a display panel 501 includes a display substrate 300 having a major top surface area that is subdivided into a display area (DA) populated by pixel units and a periphery area (PA) that at least partially surrounds the display area (DA). The periphery area (PA) of the display substrate 300 has a first gate lines and horizontal storage lines driving part 101 mounted thereon and a first data lines and vertical storage lines driving part 200 also formed on the display substrate 300. An exterior controller (not shown) operatively couples to the display panel 501 for supplying control and/or data signals to at least the first gate/data lines and horizontal/vertical storage lines driving parts, 101 and 200 respectively. For example, the exterior controller (not shown) may be a timing controller that is operatively coupled to each of the first data/storage lines driving part 200 and the first gate lines driving part 101. The display substrate 300 may further include a second gate lines driving part 102 disposed on an other side of the periphery area (PA) and facing the first gate lines driving part 101. More specifically for the exemplary display panel 501 shown in FIG. 1, a portion substantially displaying a corresponding image is denoted as the display area DA and it is understood to include a plurality of pixel units $P_{x1}$, $P_{x2}$, $P_{x3}$, $P_{x4}$, $P_{x5}$ each having a respective pixel-electrode. Another portion of the display panel 501 is denoted as the periphery area PA and it contains one or more monolithic integrated circuits disposed thereon. More specifically, for the exemplary layout of FIG. 1, the periphery area (PA) has the first and second gate lines driving parts 101 and 102 disposed along left and right side portions thereof and has at least a first data/storage lines driving part 200 is disposed in a top portion of the periphery area PA.

The first gate lines driving part 101 includes a first shift register having a plurality of stages $SRC_{a-1}$, $SRC_a$ and $SRC_{a+1}$, dependently connected each other; where herein, 'a' is a natural number more than 2. Also, the second gate driving part 102 includes a second shift register having a plurality of stages $SRC_{b-1}$, $SRC_b$ and $SRC_{b+1}$, dependently connected each other; where herein, 'b' is a natural number more than 2. In one embodiment, the first and second gate lines driving parts 101 and 102 are directly monolithically integrated on the display substrate 300. That is, the first and second gate lines driving parts 101 and 102 may be simultaneously formed in a process of forming the semiconductive and/or other patterns that constitute the pixel units $P_{x1}$, $P_{x2}$, $P_{x3}$, $P_{x4}$ and $P_{x5}$.

Accordingly for FIG. 1, the exemplary embodiment is described as having the respective first and second gate H-storage lines driving parts 101 and 102 where these respectively include a first shift register and a second shift register. However, the first and second gate driving parts 101 and 102 may alternatively be provided as mounted driving chips mounted to, rather than monolithically integrated with the display substrate 300. More specifically, the first and second gate lines driving parts 101 and 102 may be mounted on the display substrate 300 through an adhesive member of an anisotropic conductive film type, etc.

As seen in FIG. 1, the display substrate 300 includes a plurality of gate/data signal wirings plus so-called, horizontal (H) or "transverse" storage lines STL11, STL12, STL13 and STL 14 crossing the signal wirings and so-called, vertical (V) or "longitudinal" storage lines STL21, STL22 and STL23 crossing with the "transverse" (H extending) storage lines. The display substrate 300 further includes a first, a second, a third and a fourth plate voltage (e.g., Vcom) delivering border line wirings BL1, BL2, BL3 and BL4.

The gate/data signal wirings includes a plurality of gate lines $GL_{m-1}$, $GL_m$, $GL_{m+1}$ and $GL_{m+2}$, where herein, 'm' is a natural number more than 2, and a plurality of data lines $DL_{k-1}$, $DL_k$ and $DL_{k+1}$, where herein, 'k' is a natural number more than 2. The gate lines $GL_{m-1}$, $GL_m$, $GL_{m+1}$ and $GL_{m+2}$ are horizontally extended in a first direction DN1 of the display substrate 300 and arranged spaced apart from each other along a second direction DN2 (a.k.a. the vertical (V) direction). The second direction DN2 is different from the first direction DN1. The second direction DN2 may be perpendicular with respect to the first direction DN1. The data lines $DL_{k-1}$, $DL_k$ and $DL_{k+1}$ are extended in the second direction DN2 of the display substrate 300 and arranged spaced from one another along the first direction DN1.

Each of the gate lines $GL_{m-1}$, $GL_m$, $GL_{m+1}$ and $GL_{m+2}$ may be connected to and driven by at least one of the first and second gate lines driving parts 101 and 102. In the illustrated embodiment, the first gate lines driving part 101 is disposed adjacent to and connected to respective first ends (left ends) of its driven ones among gate lines $GL_{m-1}$, $GL_m$, $GL_{m+1}$ and $GL_{m+2}$, and the second gate lines driving part 102 is disposed adjacent to and connected to respective second ends (right ends) of its driven ones among gate lines $GL_{m-1}$, $GL_m$, $GL_{m+1}$ and $GL_{m+2}$. The second ends may be opposed to the first ends along the first direction DN1.

For example, in one embodiment, among the gate lines $GL_{m-1}$, $GL_m$, $GL_{m+1}$ and $GL_{m+2}$, the odd-numbered gate lines $GL_{2n-1}$ (where herein, 'n' is a natural number), are connected to be driven by the first gate lines driving part 101, and the even-numbered gate lines $GL_{2n}$ (where herein, 'n' is a natural number) are connected to be driven by the second gate lines driving part 102. More specifically, the odd-numbered gate lines $GL_{2n-1}$ are connected to the respective stages $SRC_{a-1}$, $SRC_a$ and $SRC_{a+1}$ of the first gate lines driving part 101, and the even-numbered gate lines $GL_{2n}$ are connected to the stages $SRC_{b-1}$, $SRC_b$ and $SRC_{b+1}$ of the second gate lines driving part 102.

Alternatively, among the gate lines $GL_{m-1}$, $GL_m$, $GL_{m+1}$ and $GL_{m+2}$ from the first gate line to a selected n-th gate line (where herein 'n' is a natural number), these may be connected to the first gate lines driving part 101, and from a n+1-th gate line to a last gate line these may be connected to the second gate lines driving part 102. Alternatively, among the gate lines $GL_{m-1}$, $GL_m$, $GL_{m+1}$ and $GL_{m+2}$, each may be connected at a first end (left end) to first gate lines driving part 101, and at a second end (right end) to the second gate lines driving part 102. Although not shown in FIG. 1, in another embodiment, one of the first and second gate lines driving part may be omitted and all the gate lines $GL_{m-1}$, $GL_m$, $GL_{m+1}$ and $GL_{m+2}$ may be connected to the included other gate lines driving part.

Referring to FIG. 2A, a first pixel unit $P_{x1}$ is disposed between a sequence of two gate lines that are substantially spaced apart from to each other, for example between a m-th gate line $GL_m$ and a m+1-th gate line $GL_{m+1}$. A distance between the next in sequence, m+1-th gate line $GL_{m+1}$ and the m+2-th gate line $GL_{m+2}$ is less than the distance between the substantially spaced apart m-th gate line $GL_m$ and the m+1-th gate line $GL_{m+1}$, so that a pixel is not disposed between the more closely spaced together m+1-th gate line $GL_{m+1}$ and the m+2-th gate line $GL_{m+2}$. A pixel may be disposed between the next in sequence and next substantially spaced apart m+2-th gate line $GL_{m+2}$ (shown) and the m+3-th gate line $GL_{m+3}$ (not shown). The m+3-th gate line $GL_{m+3}$ is disposed in the second direction of the m+2-th gate line $GL_{m+2}$.

The data lines $DL_{k-1}$, $DL_k$ and $DL_{k+1}$ are connected to at least the first data/storage lines driving part 200. In one embodiment, where in addition to the least first data/storage lines driving part 200 there is provided one or more additional data/storage lines driving parts (e.g., integrated circuit chips), the first data/storage lines driving chip may be connected from a first data line to a w-th data line (where herein 'w' is a natural number more than 2), and a second data/storage lines driving chip may be connected from a w-th data line to a last data line. The first pixel unit $P_{x1}$ and the second pixel unit $P_{x2}$ are disposed relatively closely adjacent to each other so as to share a common vertical storage line (STL21) between them as shown for example in the top plan view of FIG. 2A and also in the cross sectional view of FIG. 2B where, in the latter case, the shared common vertical storage line (STL21) is seen to be capacitively overlapped by corresponding pixel-electrodes PE1 and PE2.

Additionally, the first pixel unit $P_{x1}$ and the second pixel unit $P_{x2}$ are disposed between (sandwiched between) two spaced apart but sequentially successive data lines, for example, between a k−1-th data line $DL_{k-1}$ and k-th data line $DL_k$. Similarly, the next sequentially successive pair, namely, the third pixel $P_{x3}$ and the fourth pixel $P_{x4}$ adjacent in the first direction DN1 may be disposed between the k-th data line $DL_k$ and k+1-th data line $DL_{k+1}$. Similarly, the yet next sequentially successive pair, namely, the one that includes a fifth pixel $P_{x5}$ is disposed in the first direction DN1 to the right of the fourth pixel $P_{x4}$.

The first pixel $P_{x1}$ includes a respective first switching element SW1 and a respective first pixel electrode PE1 connected to a drain of the first switching element SW1 by way of a first contact part CNT1. The first switching element SW1 also has a gate electrode connected to the m-th gate line $GL_m$ and a source connected to the k−1-th data line $DL_{k-1}$. Similarly the second pixel $P_{x2}$ includes a respective second switching element SW2 and a respective second pixel electrode PE2 connected to a drain of the second switching element SW2 by way of a second contact part CNT2. The second switching element SW2 is also connected to the m-th gate line $GL_m$ and respectively to the k-th data line $DL_k$.

As seen in FIG. 2A, the next sequentially successive pair of pixel units, namely, the third pixel unit $P_{x3}$ and the fourth pixel $P_{x4}$. are disposed in vertically flipped, mirror image relation to the first pair ($P_{x1}$ and $P_{x2}$). The third pixel unit $P_{x3}$ includes a respective third switching element SW3 and a third pixel electrode PE3, and it is connected to the m+1-th gate line $GL_{m+1}$ and the k-th data line $DL_k$. The fourth pixel unit $P_{x4}$ includes a respective fourth switching element SW4 and a fourth pixel electrode PE4, and it is connected to the m+1-th gate line $GL_{m+1}$ and the k+1-th data line $DL_{k+1}$. Additionally, as partially shown in FIG. 2A, the yet next sequentially successive pair of pixel units, namely, the one including the fifth pixel $P_{x5}$ is disposed in vertically flipped, mirror image relation to the second pair ($P_{x3}$ and $P_{x4}$). The fifth pixel $P_{x5}$ is connected to the m-th gate line $GL_m$ and the k+1-th data line $DL_{k+1}$. The sixth pixel $P_{x6}$ (not shown) is understood to be disposed in the first direction DN1 to the right of the fifth pixel $P_{x5}$ and it may be connected to the m-th gate line $GL_m$ and a k+2-th data line $DL_{k+2}$. Also, the sixth pixel $P_{x6}$ may be connected to the m+1-th gate line $GL_{m+1}$ and the k+2-th data line $DL_{k+2}$.

The transverse storage lines (horizontally extending ones, or so-called, H-storage lines) STL11, STL12, STL13 and STL14 are extended in the first direction DN1. The transverse storage lines STL11, STL12, STL13 and STL14 cross the data lines $DL_{k-1}$, $DL_k$ and $DL_{k+1}$. The display panel 501 may further include branched-off storage electrodes TE that divaricate integrally and orthogonally from respective ones of the H-storage lines and thus extend in the second direction DN2 (the vertical direction). The branched-off storage electrodes TE may be disposed adjacent both edges in the first direction DN1 of the data lines $DL_{k-1}$, $DL_k$ and $DL_{k+1}$ respectively. The branched-off storage electrodes TE may be partially overlapped with the both edges of the corresponding data line (DL) or may be disposed apart from such edges. As mentioned, the branched-off storage electrodes TE are connected to the transverse storage lines STL11, STL12, STL13 and STL14 and simultaneously are spaced apart from each other in the first direction DN1. The transverse storage lines STL11, STL12, STL13 and STL14 are connected each other by the respective, branched-off storage electrodes TE so as to thereby form a storage lines mesh or network. Conversely, the branched-off and vertically extending storage electrodes TE are connected each other by the transverse storage lines STL11, STL12, STL13 and STL14 so as to thereby also form the storage lines mesh or network.

Alternatively, rather than having branched-off storage electrodes TE as shown in FIGS. 1 and 2A integrally branching-off from the H-storage lines, the display panel 501 may include overlapping electrodes (not shown) divaricated in the second direction DN2 and disposed on the area having the data lines $DL_{k-1}$, $DL_k$ and $DL_{k+1}$. That is, an electrode having a shape which adjacent storage electrodes TE are integrated is defined as the overlapping electrode. The adjacent storage electrodes TE are disposed on both sides of on of the data lines $DL_{k-1}$, $DL_k$ and $DL_{k+1}$. The transverse storage lines STL11, STL12, STL13 and STL14 are connected each other by the overlapping electrodes. Also, the overlapping electrodes may be connected each other by the transverse storage lines STL11, STL12, STL13 and STL14. The overlapping electrodes are overlapped with each data line $DL_{k-1}$, $DL_k$ and $DL_{k+1}$. A wiring width in the first direction D1 of the overlapping electrodes may be substantially same as a wiring width of each data line $DL_{k-1}$, $DL_k$ and $DL_{k+1}$ or may be more than a wiring width of each data line $DL_{k-1}$, $DL_k$ and $DL_{k+1}$. Seeing a plan view, due to overlapping with the data lines $DL_{k-1}$, $DL_k$ and $DL_{k+1}$, the overlapping electrodes may be not observed or may be observed as both ends of the overlapping electrodes are more protrude than the data lines $DL_{k-1}$, $DL_k$ and $DL_{k+1}$.

For example, a first transverse storage lines STL11 disposed between the m-th gate line $GL_m$ and a m+1-th data line $GL_{m+1}$. The second transverse storage lines STL12 disposed in the second direction DN2 of the first transverse storage lines STL11 also disposed between the m-th gate line $GL_m$ and the m+1-th data line $GL_{m+1}$. The first transverse storage lines STL11 disposed more closely to the m-th data line $GL_m$ than the m+1-th gate line $GL_{m+1}$. The second transverse storage lines STL12 disposed more closely to the m+1-th data line $GL_{m+1}$ than the m-th gate line $GL_m$. A third transverse storage lines STL13 disposed in the second direction DN2 of the second transverse storage lines STL12 is disposed adjacent to the m+2-th data line $GL_{m+2}$. The m+1-th gate line $GL_{m+1}$ and the m+2-th data line $GL_{m+2}$ are disposed between the second transverse storage lines STL12 and the third transverse storage lines STL13.

Figure 2B:
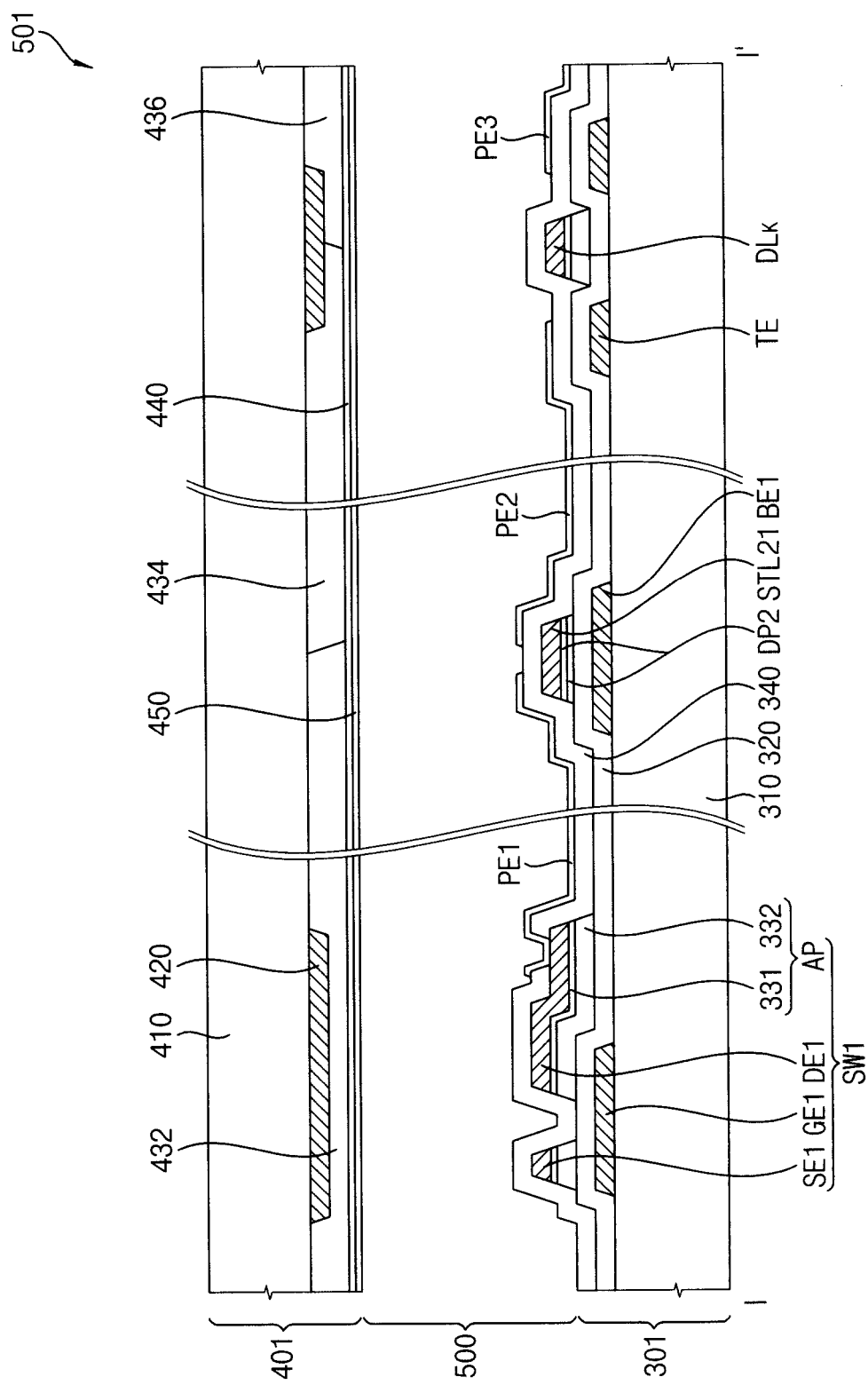
FIG. 2B is a cross-sectional view as seen cutting along a line I-I' of FIG. 2A.

In FIGS. 2A and 2B the branched-off storage electrodes TE are disposed adjacent to both ends of the data lines $DL_{k-1}$, $DL_k$ and $DL_{k+1}$. However, the storage electrodes TE may be generally overlapped with the data lines $DL_{k-1}$, $DL_k$ and $DL_{k+1}$ in a portion adjacent to the transverse storage lines STL11, STL12, STL13 and STL14.

The longitudinal storage lines (vertically-extending ones) STL21, STL22 and STL23 are extended in the second direction DN2 and cross the transverse storage lines STL11, STL12 and STL13 and the gate lines $GL_{m-1}$, $GL_m$, $GL_{m+1}$ and $GL_{m+2}$. Simultaneously, the longitudinal storage lines STL21, STL22 and STL23 are connected with the transverse storage lines STL11, STL12 and STL13 by making contact with the transverse storage lines STL11, STL12 and STL13 by way of respective contact vias. The longitudinal storage lines STL21, STL22 and STL23 are disposed between the data lines $DL_{k-1}$, $DL_k$ and $DL_{k+1}$ adjacent to each other. Each longitudinal storage line STL21, STL22 and STL23 is a wiring sequentially extended in the second direction DN2. That is, each longitudinal storage line STL21, STL22 and STL23 is not wiring composed of contacting patterns formed from different layer but a wiring composed by one pattern defined in a respective one layer.

For example, the first longitudinal storage line STL21 is disposed between the k−1-th data line $DL_{k-1}$ and the k-th data line $DL_k$. Therefore, the first pixel unit $P_{x1}$ is disposed between (sandwiched between) the k−1-th data line $DL_{k-1}$ and the first longitudinal storage line STL21. Simultaneously, the second pixel unit $P_{x2}$ is disposed between (sandwiched between) the k-th data line $DL_k$ and the first longitudinal storage line STL21. The second longitudinal storage line STL22 disposed in the first direction DN1 of the first longitudinal storage line STL21 is disposed between k-th data line $DL_k$ and the k+1-th data line $DL_{k+1}$. Therefore, the third pixel unit $P_{x3}$ is disposed between the k-th data line $DL_k$ and the second longitudinal storage line STL22. Simultaneously, the fourth pixel unit $P_A$ is disposed between the k+1-th data line $DL_{k+1}$ and the second longitudinal storage line STL22. A third longitudinal storage line STL23 is disposed in the first direction DN1 of the second longitudinal storage line STL22. The fifth pixel unit $P_{x5}$ is disposed between the k+1-th data line $DL_{k+1}$ and the third longitudinal storage line STL23.

Although the longitudinal storage lines STL21, STL22 and STL23 are formed in a different layer, they nonetheless make electric contact with crossing-by respective ones of the transverse storage lines STL11, STL12, STL13 and STL14 at a respective one or more portions where they are crossing with selected ones of the transverse storage lines STL11, STL12, STL13 and STL14. More specifically, the first longitudinal storage line STL21 may selectively make contact with the first and third longitudinal storage lines STL11 and STL13 which are odd-numbered longitudinal storage lines while not making such crossing contact with STL12 which is an even-numbered longitudinal storage line. To this end, the first longitudinal storage line STL21 is connected to the first transverse storage line STL11 by way of contact through a so-called, third contact part CNT3 provided in an area between the first and second switching elements, SW1 and SW2. The third contact part CNT3 has a so-called, first contact electrode CE1 extending therethrough (as shown for example in FIG. 3B) and providing a short-circuiting connection between the crossing there-at first longitudinal storage line STL21 and first transverse storage line STL11. In similar fashion, the third longitudinal storage line STL23 may be connected to the first and third transverse storage lines STL11 and STL13 in regions between corresponding switching elements of those transverse storage lines. For the given embodiment where the first and third longitudinal storage lines STL21 and STL23 do not make short-circuiting connection with the second transverse storage line STL12, they instead insulatively cross with the second transverse storage line STL12 in regions where corresponding switching elements (e.g., SW3 and SW4) are not formed.

Simultaneously, the second longitudinal storage line STL22 is connected to even-numbered transverse storage lines including the second transverse storage line STL12 but not to odd-numbered transverse storage lines such as STL11. More specifically, the second longitudinal storage line STL22 is connected by making contact by way of a fourth contact part (CNT4, positioned between SW3 and SW4) with the second transverse storage line STL12 where the fourth contact part (CNT4) has a respective second contact electrode CE2 extending therethrough. In this example, the second longitudinal storage line STL22 does not make contact with, but instead insulatively crosses the odd-numbered, first and third transverse storage lines STL11 and STL13.

Light blocking electrodes BE1 and BE2 made of an opaque material may be disposed below the longitudinal storage lines STL21, STL22 and STL23. The light blocking electrodes BE1 and BE2 are physically and electrically separated from the longitudinal storage line STL21, STL22 and STL23. They are also physically and electrically separated from the transverse storage lines STL11, STL12, STL13 and STL14. The light blocking electrodes BE1 and BE2 may be formed from the same material layer as that used for forming the gate lines $GL_{m-1}$, $GL_m$, $GL_{m+1}$ and $GL_{m+2}$. A width of the light blocking electrodes BE1 and BE2 may be wider than a width of the longitudinal storage lines STL21, STL22 and STL23.

For example and more specifically as shown in FIG. 2B, a first light blocking electrode BE1 is disposed below the first longitudinal storage line STL21. Side edges of the first longitudinal storage line STL21 and of the first light blocking electrode BE1 may be overlapped by the first pixel electrode PE1 and by the second pixel electrode PE2. Alternatively, in a not-illustrated other example, the first longitudinal storage line STL21 is not overlapped by the first and second electrodes PE1 and PE2 while the first light blocking electrode BE1 is still nonetheless capacitively coupled to the first and second electrodes PE1 and PE2. A second light blocking electrode BE2 is disposed in the first direction DN1 of the first light blocking electrode BE1 and is overlapped with the second longitudinal storage line STL22.

Referring to FIG. 1, in the periphery area (PA) there are provided first, second, third and fourth plate voltage (e.g., Vcom) delivering wirings (a.k.a. herein as "common voltage wirings"), BL1, BL2, BL3 and BL4; where the latter are disposed around the periphery area PA so as to surround the display area DA and to deliver the desired plate voltage (e.g., Vcom) to the vertical storage lines and to the H-storage lines.

More specifically, the first plate voltage (e.g., Vcom) delivering wiring, BL1 is disposed in the upper part of the illustrated periphery area PA, between the data driving part(s) 200 and the first (topmost) gate line and extended in the first direction DN1. The first plate voltage (e.g., Vcom) delivering wiring BL1 may be formed from the same material layer as that of the gate lines $GL_{m-1}$, $GL_m$, $GL_{m+1}$ and $GL_{m+2}$. The first plate voltage (e.g., Vcom) delivering wiring BL1 is directly connected to the longitudinal storage lines STL21, STL22 and STL23, and provides each of them with the desired plate voltage (e.g., the common voltage, Vcom). The desired plate voltage (e.g., the common voltage) may be produced in the data driving part(s) 200 by using a signal received from an exterior controller. The first plate voltage (e.g., Vcom) delivering wiring BL1 is connected to the data driving part(s) 200, so that the plate voltage (e.g., the common voltage) produced by the data driving part(s) 200 may be distributively provided through the first plate voltage (e.g., Vcom) delivering wiring BL1 to the connected-thereto longitudinal storage lines STL21, STL22 and STL23.

The second plate voltage (e.g., Vcom) delivering wiring BL2 is disposed along the bottom of the periphery area (PA) and extends in the same first direction, DN1 as does the first common voltage wiring BL1. While the first common voltage wiring BL1 is connected to each respective top end of the longitudinal storage lines STL21, STL22 and STL23; the second common voltage wiring BL2 is connected to each opposed, bottom end of the longitudinal storage lines STL21, STL22 and STL23. The second common voltage wiring BL2 may be formed from the same material layer as that of the gate lines $GL_{m-1}$, $GL_m$, $GL_{m+1}$ and $GL_{m+2}$.

The third plate voltage (e.g., Vcom) delivering wiring BL3 is disposed along the left side of the periphery area (PA) and connects to the respective left ends of the first and second common voltage wirings BL1 and BL2. The third plate voltage (e.g., Vcom) delivering wiring BL3 is extended in the second direction DN2. The third common voltage wiring BL3 may be disposed between the first data driving part 101 and the first data line. The third common voltage wiring BL3 may be formed from the same material layer as that of the gate lines $GL_{m-1}$, $GL_m$, $GL_{m+1}$ and $GL_{m+2}$. The third common voltage wiring BL3 is connected to each of the transverse storage lines STL11, STL12, STL13 and STL14, so that the desired plate voltage (e.g., the common voltage) is distributively provided by the third common voltage wiring BL3 to corresponding left ends of the transverse storage lines STL11, STL12, STL13 and STL14.

The fourth common voltage wiring BL4 is disposed on the right side of the periphery area (PA) and extends in the second direction DN2 and connects the right ends of the first and second common voltage wirings BL1 and BL2. The fourth common voltage wiring BL4 is disposed between a last data line and the second gate lines driving part 102. While the third common voltage wiring BL3 is connected to each one of the left ends of the transverse storage lines STL11, STL12, STL13 and STL14, the fourth common voltage wiring BL4 is connected to each one of the opposed right ends of them.

The desired plate voltage (e.g., Vcom) is an analog voltage signal that may include an AC component as well as a DC component and may be propagated to each of the transverse storage lines STL11, STL12, STL13 and STL14 and the longitudinal storage lines STL21, STL22 and STL23 in a mesh like distributing fashion by the first through the fourth common voltage wirings BL1, BL2, BL3 and BL4. The first to the fourth common voltage wirings BL1, BL2, BL3 and BL4 should each be wider in width and/or thickness than the corresponding ones of the transverse storage lines STL11, STL12, STL13 and STL14 and the longitudinal storage lines STL21, STL22 and STL23, in order to quickly apply with a relatively small RC delay the desired analog plate voltage signal (e.g., Vcom) to the transverse storage lines STL11, STL12, STL13 and STL14 and the longitudinal storage lines STL21, STL22 and STL23 and without a substantial voltage drop. However, widths of some of the wirings may be relatively decreased thanks to the presence absence of the longitudinal storage lines STL21, STL22 and STL23. That is, a width of the first to the fourth common voltage wirings BL1, BL2, BL3 and BL4, particularly a width of the third and fourth common voltage wirings BL3 and BL4 may be minimized because of the presence of the longitudinal storage lines STL21, STL22 and STL23, which basically are additional means for widely distributing and propagating the desired analog plate voltage signal (e.g., Vcom) along the vertical second direction DN2.

In a hypothetical other design, where the longitudinal storage lines STL21, STL22 and STL23 are hypothetically absent, the widths of the first through fourth common voltage wirings BL1, BL2, BL3 and BL4 may have to be substantially increased and a wiring resistivity of those wirings may have to be substantially reduced by, for example changing the forming material of the wiring to one of a higher conductivity in order to achieve similar signal propagation speed. However, in accordance with the present disclosure of invention, a wiring width of the first to the fourth common voltage wirings BL1, BL2, BL3 and BL4 can be minimized by including the longitudinal storage lines STL21, STL22 and STL23, which in essence are extension of the effective widths of the left and right (third and fourth) common voltage wirings BL3 and BL4. Furthermore a voltage drop due to the RC characteristics of the signal distribution network (the one that distributes desired plate voltage signal (e.g., Vcom)) is minimized. An extent ratio of the periphery area PA with respect to the display area DA therefore can be made smaller than otherwise possible by reducing the area extents consumed by the first through fourth common voltage wirings BL1, BL2, BL3 and BL4, and instead making up for the loss by way of the signal distribution capabilities of the vertical and horizontal storage lines. Accordingly, an extent of the display area DA relative to the overall area of the substrate is maximized. A decline of display quality due to reduction in area consumed by BL1-BL4 may be prevented. Simultaneously, the extent of the display area DA may be maximized.

The display substrate 300 may further include a storage connection fanout wiring SCL and a data connection fanout wiring DCL. The first common voltage wiring BL1 is connected to the data driving part(s) 200 through the storage connection fanout wiring SCL. The data lines $DL_{k-1}$, $DL_k$, $DL_{k+1}$ are connected to the data driving part(s) 200 through the data connection fanout wiring DCL. The storage connection fanout wiring SCL may be directly connected to the first common voltage wiring BL1 and may be formed integrally therewith.

The display panel 501 shown in FIGS. 1 and 2A further includes a facing substrate 400 spaced apart from and facing the display substrate 300. The facing substrate 400 will be described below in a cross sectional structure with reference to FIG. 2B.

FIG. 2B is a cross-sectional view cutting along a line I-I' of FIG. 2A.

Referring to FIGS. 1, 2A and 2B, the first switching element SW1 of the display substrate 300 includes a first gate electrode GE1 formed on a first base substrate 310, an active pattern AP (semiconductive pattern) formed above and insulated from the first gate electrode GE1, a first source electrode SE1 and a first drain electrode DE1 formed on the active pattern AP.

The first gate electrode GE is connected to the m-th gate line $GL_m$ and the first source electrode SE1 is connected to the k-1-th data line $DL_{k-1}$. The first drain electrode DE1 is spaced from the first source electrode SE1 and is connected to the first pixel electrode PE1 through the first contact part CNT1. A gate insulation layer 320 is disposed between the first gate electrode GE1 and the active pattern AP as a first insulation layer, so that the first gate electrode GE1 and the active pattern AP are insulated from one another. A passivation layer 340 is formed on the first switching element SW1 as a second insulation layer, and includes the first contact part CNT1 exposing the first drain electrode DE1. The first pixel electrode PE1 is formed on the passivation layer 340. The active pattern AP includes a semiconductive layer 331 and an ohmic contact layer 332. The semiconductive layer 331 may include amorphous silicon or a semiconductive metal oxide. An edge of the active pattern AP may be corresponded (aligned) to an overall edge of the first source electrode SE1 and the first drain electrode DE1. The active pattern AP may be partially exposed (not covered by an electrode) between the first source electrode SE1 and the first drain electrode DE1. Although it did not show in drawings, a third insulation layer may be formed between the passivation layer 340 and the first and second pixel electrodes PE1 and PE2. An organic layer which is a flattened layer (planarization layer) may be formed as the third insulation layer. The third insulation layer may include holes formed therethrough corresponding to the holes formed through the second insulation layer.

Respective ones of the cross sectional structures of the second to the fourth switching elements SW2, SW3 and SW4 are substantially same as that of the first switching element SW1 other than the specific connected signal wirings. Therefore, repetitive explanation will be omitted.

A first dummy pattern DP1 having substantially a same multi-layered structure as that of the active pattern AP is formed under the k-th data line $DL_k$. The first dummy pattern DP1 is formed under the k-th data line $DL_k$ in a same process used for forming and patterning the active pattern AP.

The second pixel electrode PE2 and the third pixel electrode PE3 are respectively disposed on both side of the k-th data line $DL_k$. The k-th data line $DL_k$ may spaced apart from each of the second and third pixel electrodes PE2 and PE3. Each one of ends of the second pixel electrode PE2 and the third pixel electrode PE3 adjacent to the k-th data line $DL_k$ may be overlapped with the respective branched-off storage electrodes TE provided in that location.

The first light blocking electrode BE1 is disposed under the first longitudinal storage line STL21, so that the first light blocking electrode BE1 and the first longitudinal storage line STL21 are insulated by the gate insulation layer 320. A second dummy pattern DP2 is disposed between the first longitudinal storage line STL21 and the gate insulation layer 320. The second dummy pattern DP2 has substantially a same multi-layered structure as the first dummy pattern DP1. The first pixel electrode BE1 may be overlapped with each one ends of the first longitudinal storage line STL21 and the first light blocking electrode BE1. Each of the respective ends of the first longitudinal storage line STL21 and the first light blocking electrode BE1 may be overlapped with the second pixel electrode PE2. Since a width of the first light blocking electrode BE1 is wider than a width of the first longitudinal storage line STL21, one end of the first light blocking electrode BE1 is protruded with respect to the first longitudinal storage line STL21 in a corresponding plane structure (as seen in a top plan view).

Also, each of the first and second pixel electrode PE1 and PE2 is respectively overlapped with both ends of the first longitudinal storage line STL21 and may not be overlapped with the first longitudinal storage line STL21.

In the above embodiment, the first switching element SW1, the first longitudinal storage line STL21, the k-th data line $DL_k$ and the first and second pixel electrode PE1 and PE2 are described in terms of cross sectional structure. Similarly the respective cross sectional structures of the second switching element SW2, the second longitudinal storage line STL22, the k+1-th data line $DL_{k+1}$ and the third and fourth pixel electrodes PE3 and PE4 are substantially same as a cross sectional structure of the first switching element SW1, the first longitudinal storage line STL21, the k-th data line $DL_k$ and the first and second pixel electrodes PE1 and PE2. Therefore, a repetitive explanation will be omitted.

The facing substrate 400 includes a second base substrate 410, a light blocking pattern 420, color filters 432, 434 and 436, an over coating layer 440 and a common electrode 450.

The light blocking pattern 420 (a.k.a. black matrix) is formed on the second base substrate 410 facing the gate lines $GL_{m-1}$, $GL_m$, $GL_{m+1}$ and $GL_{m+2}$, the data lines $DL_{k-1}$, $DL_k$ and $DL_{k+1}$, the switching elements SW1, SW2, SW3 and SW4, the transverse storage lines STL11, STL12, STL13 and STL14 and the longitudinal storage lines STL21, STL22 and STL23.

The color filters 432, 434 and 436 are respectively formed in a plurality of areas of the second base substrate 410 divided by the light blocking pattern 420. For example, the color filters 432, 434 and 436 may include a red color filter 432, a green color filter 434 and a blue color filter 436. The first pixel unit $P_{x1}$ may include the red color filter 432 and the second pixel unit $P_{x2}$ may include the green color filter 434.

The over coating layer 440 is formed as a planarizing structure on the second base substrate 410 having the color filters 432, 434 and 436. The common electrode 450 formed on the over coating layer 440. The over coating layer 440 may be omitted.

Figure 3A:
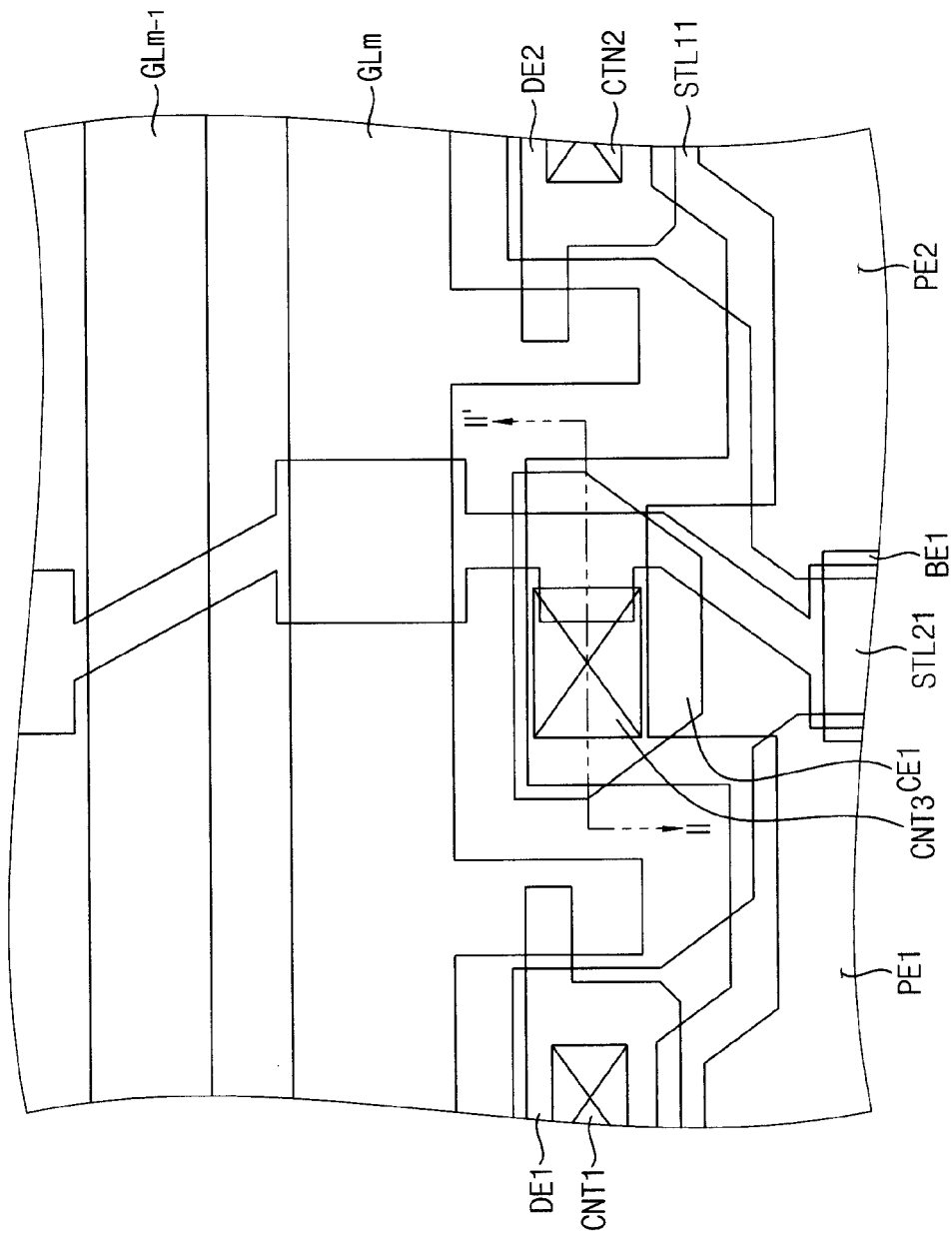
FIG. 3A is an enlarged plan view illustrating a portion A of FIG. 2A.

Hereinafter, an electrical connection relationship between the transverse storage lines STL11, STL12, STL13 and STL14 and the longitudinal storage lines STL21, STL22 and STL23 will be described with reference to FIGS. 3A and 3B. In FIG. 3A, a connection relationship between the first transverse storage lines STL11 and the first longitudinal storage lines STL21 is explained. However, the explanation is equally applied to the transverse storage lines STL12, STL13 and STL14 and the longitudinal storage lines STL22 and STL23.

FIG. 3A is an enlarged plan view illustrating a portion A of FIG. 2A, which region A is disposed between the first and second switching elements, SW1 and SW2.

Referring to FIG. 3A, the first transverse storage lines STL11 is extended in the first direction DN1 along an extending direction of the m-th gate line $GL_m$ and the m−1-th gate line $GL_{m-1}$.

The first longitudinal storage line STL21 crosses with the m-th gate line $GL_m$ and the m−1-th gate line $GL_{m-1}$. The first longitudinal storage line STL21 is insulated from the m-th gate line $GL_m$ and the m−1-th gate line $GL_{m-1}$ by the gate insulation layer 320. The first longitudinal storage line STL21 is electrically connected to the first transverse storage line STL11 in the area of the third contact part CNT3. The first contact electrode CE1 covers one area including the third contact part CNT3. The first contact electrode CE1 is shaped to make respective and enlarged-area contacts with the first transverse storage line STL11 and the first longitudinal storage line STL21. The first transverse storage line STL11 and the first longitudinal storage line STL21 may be crossed between the first switching element SW1 and the second switching element SW2.

An extent of an area of the first transverse storage line STL11 where it crosses with the first longitudinal storage line STL21 is formed more widely as compared to other portions, so that a contact extent (area) may be maximized.

Figure 3B:
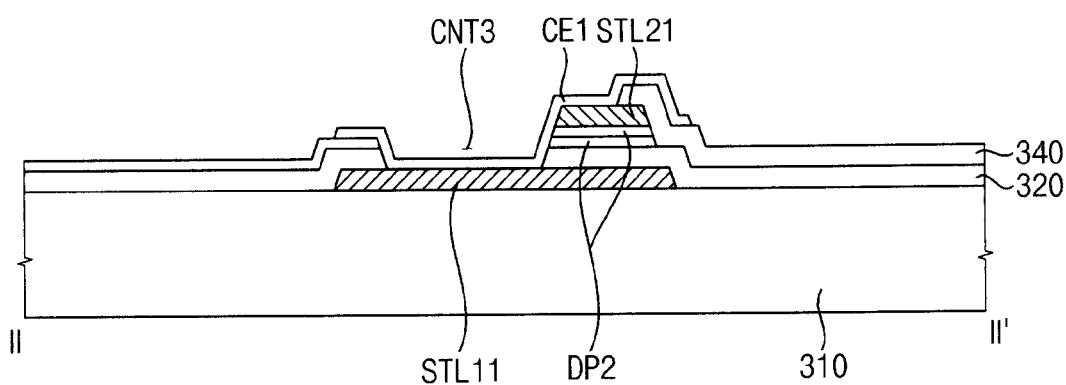
FIG. 3B is a cross-sectional view cutting along a line II-II' of FIG. 3A.

FIG. 3B is a cross-sectional view cutting along a line II-II' of FIG. 3A.

Referring to FIGS. 3A and 3B, the first transverse storage line STL11 is formed on the first base substrate 310 and the first longitudinal storage line STL21 is disposed in a higher layer above that of the first transverse storage lines STL11. The second dummy pattern DP2 is disposed below the first longitudinal storage line STL21. The first longitudinal storage line STL21 may be equaled to an edge of the second dummy pattern DP2.

In the region of third contact part CNT3, each of the first transverse storage line STL11 and the first longitudinal storage line STL21 is partially exposed for longitudinal contact along its respective length. Particularly, in the third contact part CNT3 a surface of the first transverse storage line STL11 and a sidewall surface and a surface of the first longitudinal storage line STL21 is exposed. Each of the first transverse storage line STL11 and the first longitudinal storage line STL21 may be partially exposed by communication holes formed through the gate insulation layer 320 and the passivation layer 340 corresponding to the third contact part CNT3. At this time, an etched-back sidewall surface of the second dummy pattern DP2 is partially exposed. The first transverse storage line STL11 and the first longitudinal storage line STL21 are exposed but not by separate contact holes but rather by the third contact part CNT3 which is one contact hole defined by the gate insulation layer 320 and the passivation layer 340 and shaped so as to provide wide-area contact for the contact-making, first contact electrode CE1.

The third contact part CNT3 is formed on the portion in which the first transverse storage line STL11 crosses with the first longitudinal storage line STL21, so that a contact reliability of the first transverse storage line STL11 and the first longitudinal storage line STL21 may be improved in comparison with a case of using two separate contact holes. Also, an extent of exposed area for connecting of the first transverse storage line STL11 and the first longitudinal storage line STL21 may be minimized by using the one opening of the third contact part CNT3. Therefore, decline of aperture ratio may be prevented by the area consumed for contact of the first transverse storage line STL11 with the first longitudinal storage line STL21, so that decreasing of light transmittance may be prevented.

The first contact electrode CE1 covers and electrically connects to the exposed areas of the third contact part CNT3, so that the first contact electrode CE1 makes electrical contact with each of the first transverse storage line STL11 and the first longitudinal storage line STL21. Thus, the first transverse storage line STL11 and the first longitudinal storage line STL21 are connected each other by way of the third contact part CNT3 and the first contact electrode CE1 extending therethrough. More specifically, the first contact electrode CE1 is contacted with at least an exposed top surface area of the first transverse storage line STL11 and an exposed sidewall surface of the second dummy pattern DP2 and an exposed sidewall as well as top surface area of the first longitudinal storage line STL21. Accordingly, the first transverse storage line STL11 and the first longitudinal storage line STL21 may be connected to one another in the region of the third contact part CNT3.

Hereinafter, a method of manufacturing the display substrate shown in FIGS. 1 and 2A will be explained with reference to FIG. 3C.

Figure 3C:
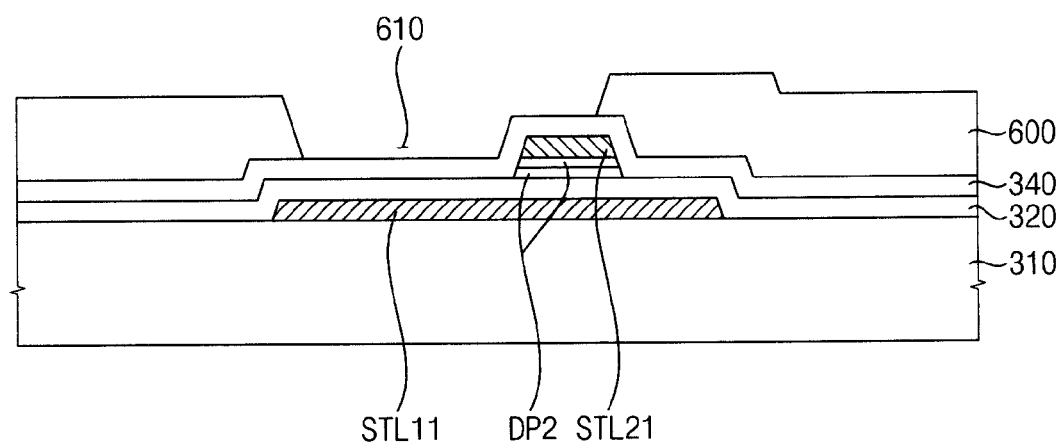
FIG. 3C is a cross-sectional view illustrating a method of manufacturing a display substrate of FIG. 3A.

FIG. 3C is a cross-sectional view illustrating part of a method of manufacturing a display substrate of FIG. 3A.

Referring to FIGS. 1, 2A, 2B and 3C, a gate metal layer is blanket formed on the first base substrate 310 and thereafter patterned so that a first metal pattern is thereby formed. The first metal pattern includes the patterned gate lines $GL_{m-1}$, $GL_m$, $GL_{m+1}$ and $GL_{m+2}$, the patterned transverse storage lines STL11, STL12, STL13 and STL14, the first and second gate electrodes GE1 and GE2 and the first and third common voltage wirings BL1 and BL3. Additionally, at this time, the deposited gate metal layer is patterned to form gate patterns within and defining the first and second gate lines driving parts 101 and 102 in a process of forming the first metal pattern.

Thereafter, the gate insulation layer 320 is formed on the first base substrate 310 having the patterned gate metal layer. Next, the semiconductor layer 331, the ohmic contact layer 332 and a data metal layer are formed on the gate insulation layer 320 in the recited sequence. A photoresist (PR) pattern is next formed on this stack of layers and used as an etch stop layer in patterning the data metal layer to thereby form a correspondingly patterned data metal layer. More specifically, the photoresist pattern (PR, not shown) is formed in corresponding to a first thickness part and a separation area between the first source electrode SE1 and the first drain electrode DE1 of SW1. The photo resist pattern may includes a second thickness part thinner than the first thickness part. The second thickness part is also formed on the separation area between the second source electrode SE2 and the second drain electrode DE2.

In addition to the data metal layer, the ohmic contact layer 332 and the semiconductor layer 331 are patterned by way of a first-etching process by using the photo resist pattern and then the second thickness part of the photo resist pattern is removed to form a residual photo pattern. The data metal layer and the ohmic contact layer 332 is then second-etched by using the residual photo pattern as an etch stop layer to thereby form the patterned active pattern AP and the patterned first and second dummy patterns, DP1 and DP2. Due to the patterning of the data metal layer, a second metal pattern is formed. The second metal pattern includes the data lines $DL_{k-1}$, $DL_k$ and $DL_{k+1}$, the first and second source electrodes SE1 and SE2, the first and second drain electrodes DE1 and DE2 and the longitudinal storage lines STL21, STL22 and STL23. At this time and in the periphery area (PA), source and drain patterns of the first and second gate driving parts 102 and 102 may be formed by patterning the data metal layer of the periphery area (PA) in a same process of forming the second metal pattern.

Thereafter, the passivation layer 340 is formed on the first base substrate 310 having the patterned second metal pattern and then a second photo resist pattern 600 (shown in FIG. 3C) is formed on the passivation layer 340. The second photo resist pattern 600 includes an opening 610 corresponding to the to-be-contacted surface areas of the third contact part CNT3. The passivation layer 340 on the first and second contact part CNT1 and CNT2 is exposed by the second photo resist pattern 600. The passivation layer 340 on the first transverse storage line STL11 and the first longitudinal storage line STL21 is exposed by the opening 610.

The passivation layer 340 and the gate insulation layer 320 are etched by using the second photo resist pattern 600 as an etch stop layer. Accordingly, corresponding area portions of the first transverse storage line STL11 and the first longitudinal storage line STL21 are exposed in the region of the third contact part CNT3.

Next, a transparent electrode layer (e.g., one made of ITO or IZO) is formed on the first transverse storage line STL11 exposed in the third contact part CNT3 and the base substrate 310 including the first longitudinal storage line STL21 and then the transparent electrode layer is patterned to thereby form the first to the fourth pixel electrodes PE1, PE2, PE3 and PE4 and the first and second contact-forming electrodes CE1 and CE2. Accordingly a display substrate 501 shown in FIGS. 1, 2A, 2B and 3A is manufactured.

Hereinafter, a connection relationship between the first longitudinal storage line STL21 and the first and third common voltage wiring BL1 and BL3 will be explained with reference to FIGS. 4A and 4B, and a connection relationship between one of the longitudinal storage lines STL21, STL22 and STL23 and the second common voltage wiring BL2 will be explained in detail with reference to FIGS. 5A and 5B.

Figure 4A:
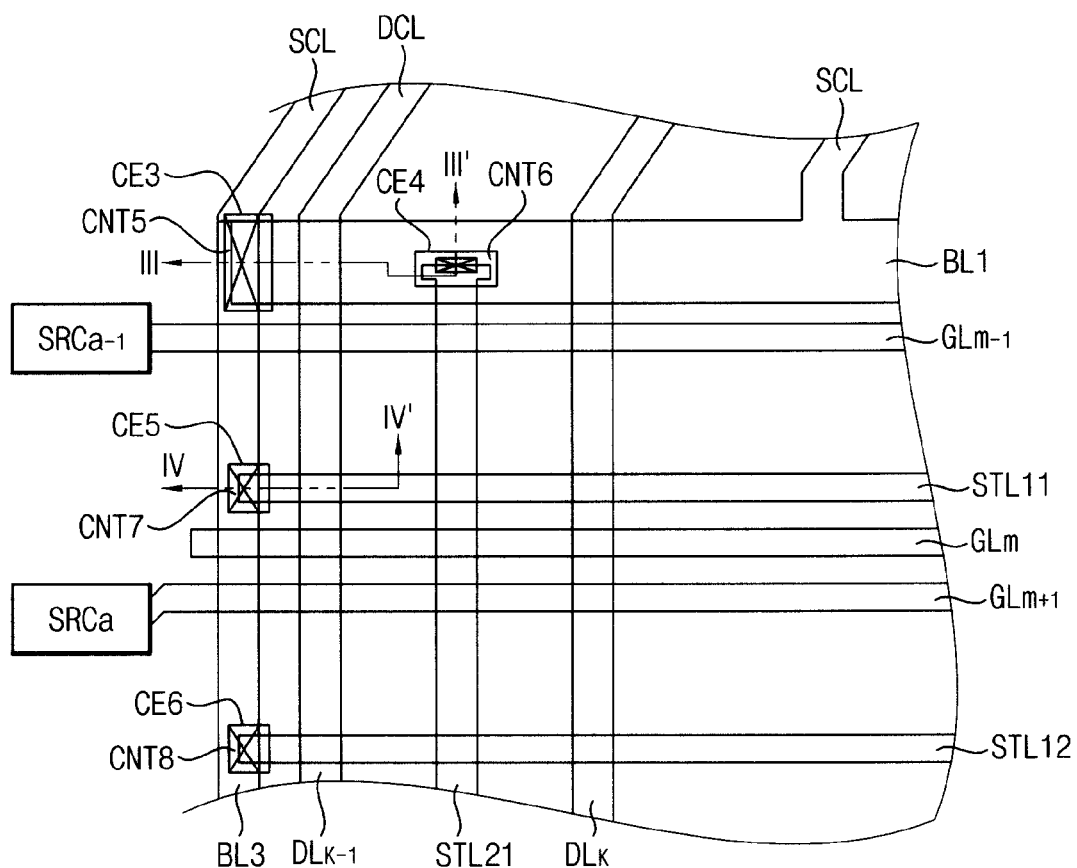
FIG. 4a is an enlarged plan view illustrating a connection relationship between a gate driving part, a data driving part and a pixel of FIG. 1.

FIG. 4A is an enlarged plan view illustrating a connection relationship between a gate driving part, a data driving part and a pixel unit of FIG. 1. FIG. 4B is a cross-sectional view cutting along a line III-III' of FIG. 4A.

Figure 4B:
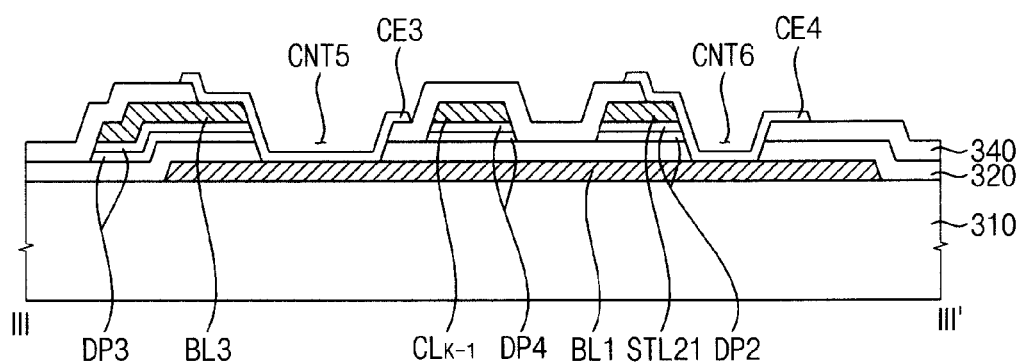
FIG. 4B is a cross-sectional view cutting along a line III-III' of FIG. 4A.
Figure 4C:
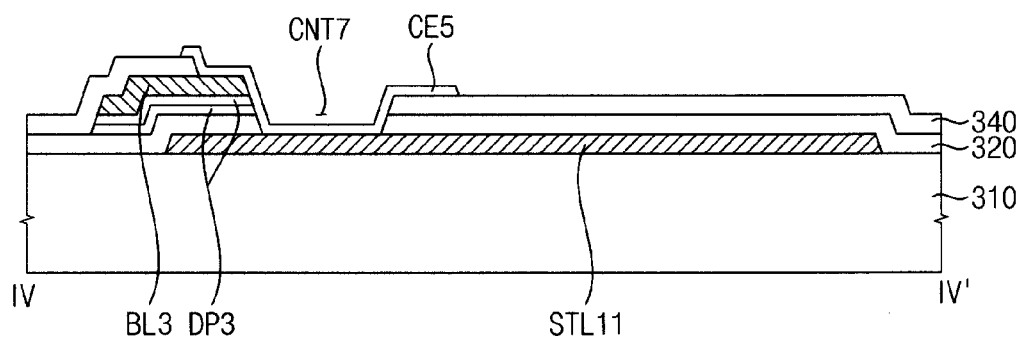
FIG. 4C is a cross-sectional view cutting along a line IV-IV' of FIG. 4A.

Referring to FIGS. 4A, 4B and 4C, the storage connection wiring SCL is integrally formed from the same layer as used for forming the third common voltage wiring BL3. Also, since the first common voltage wiring BL1 is formed from the same layer as the gate lines $GL_{m-1}$, $GL_m$, $GL_{m+1}$ and $GL_{m+2}$, the first and third common voltage wiring BL1 and BL3 are connected each other in the fifth contact part CNT5 and through use of the third contact electrode CE3 (which contact electrode is formed from same material as that used for forming the transparent pixel-electrodes). A third dummy pattern DP3 is formed below the third common voltage wiring BL3.

The third dummy pattern DP3 has a multi-layered structure same as that of the first dummy pattern DP1 formed below the k−1-th data line $DL_{k-1}$. The to-be-connected areas of the third common voltage wiring BL3 and the first common voltage wiring BL1 are exposed by an opening made through the passivation layer 340 in the region of the fifth contact part CNT5. A cross-sectional structure of the fifth contact part CNT5 may be substantially same as a cross-sectional structure of the third contact part CNT3 other than the exposed target surfaces.

Also, the first transverse storage line STL11 is connected to the third common voltage wiring BL3 in the seventh contact part CNT7 by way of the fifth contact electrode CE5. The second transverse storage line STL12 is connected to the third common voltage wiring BL3 in the eighth contact part CNT8 by way of the sixth contact electrode CE6.

In other words, respective areas of two respective metal patterns formed in different and respective layers are exposed in the fifth to the eighth contact part CNT5, CNT6, CNT7 and CNT8 and connected to one another by deposition and patterning of the same material as that used for forming the transparent pixel-electrodes. A contact reliability as between these respective metal patterns may be improved by providing appropriately large contacting areas for connecting the metal patterns to each other by way of the third to the sixth contact electrodes CE3, CE4, CE and CE6.

Figure 5A:
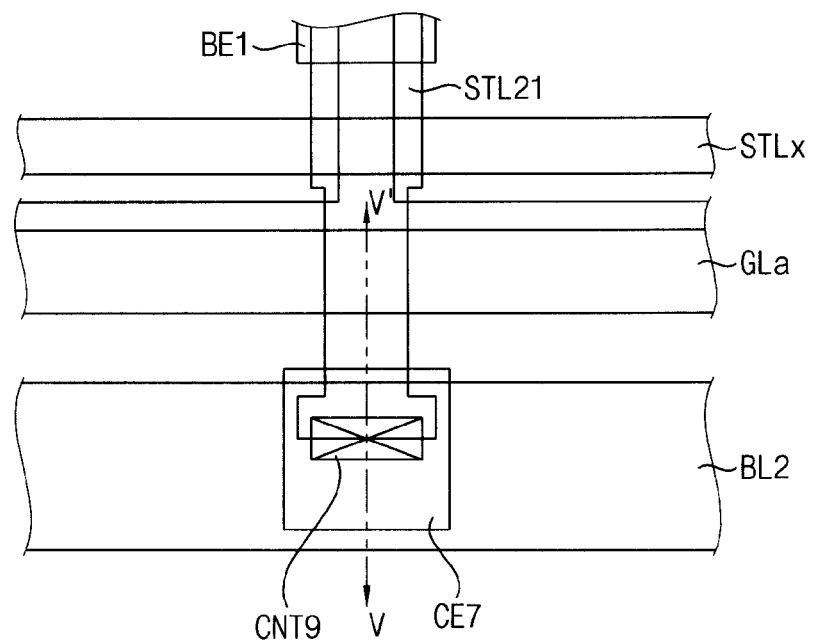
FIG. 5A is an enlarged plan view illustrating a connection relationship between a common voltage wiring and a longitudinal storage line of FIG. 1.

FIG. 5A is an enlarged plan view illustrating a connection relationship between a common voltage wiring and a longitudinal storage line of FIG. 1. FIG. 5B is a cross-sectional view cutting along a line V-V' of FIG. 5A In FIGS. 5A and 5B, a reference numeral "$GL_a$" represents a last gate line disposed opposite of the data driving part 200 among the gate lines $GL_{m-1}$, $GL_m$, $GL_{m+1}$ and $GL_{m+2}$ and a reference numeral "$STL_x$" represents a last transverse storage line disposed adjacent to the second direction DN2 of the last gate line.

Figure 5B:
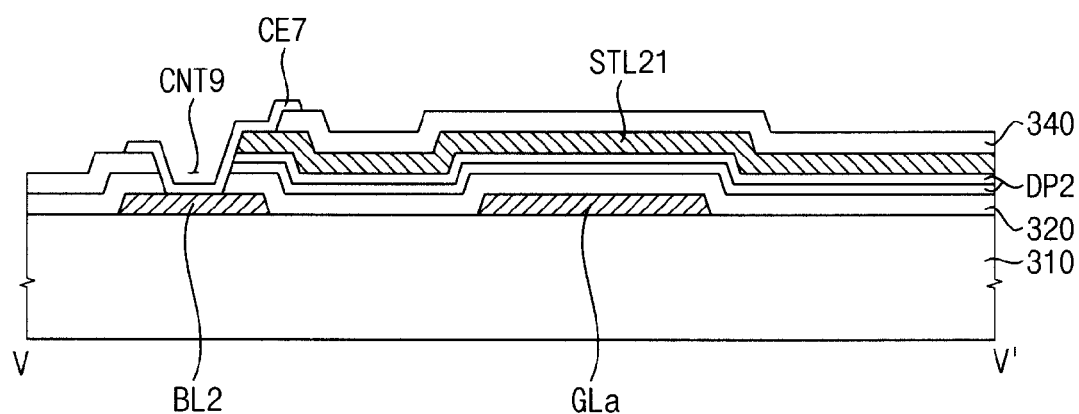
FIG. 5B is a cross-sectional view cutting along a line V-V' of FIG. 5A.

Referring to FIGS. 5A and 5B, the first longitudinal storage line STL21 crosses the last transverse storage line $STL_x$ and the last gate line $GL_a$ and is overlapped with the second common voltage wiring BL2. Since the second common voltage wiring BL2 is formed from the gate metal layer and the first longitudinal storage line STL21 is formed from the higher up data metal layer, the first common voltage wiring BL1 and the first longitudinal storage line STL21 are connected in the region of the ninth contact part CNT9 by using the seventh contact electrode CE7 (also made of the same material as that used for forming the transparent pixel-electrodes).

According to described in FIGS. 4A, 4B, 4C, 5A and 5B, the first to the fourth common voltage wirings BL1, BL2, BL3 and BL4, the transverse storage lines STL11, STL12, STL13 and STL14, the longitudinal storage lines STL21, STL22 and STL23 are connected, so that a network or mesh is formed for propagating and applying the desired plate voltage signal (e.g., Vcom) by way of the signal delivering wiring mesh to pixel units in the entire display panel 501. Two metal patterns are connected to each other in the one opening of each respective contact part by using a respective one contact electrode formed thereat, so that the first to the fourth common voltage wirings BL1, BL2, BL3 and BL4, the transverse storage lines STL11, STL12, STL13 and STL14, the longitudinal storage lines STL21, STL22 and STL23 may be connected stably and assuredly.

In other words, by using a plurality of contact parts for connecting all the various wiring patterns together, including the first to the fourth common voltage wirings BL1, BL2, BL3 and BL4, the transverse storage lines STL11, STL12, STL13 and STL14, the longitudinal storage lines STL21, STL22 and STL23, reliable shorting points are formed in each respective contact part; a generally well connected signal propagation network is formed, and all pixel units $P_{x1}$, $P_{x2}$, $P_{x3}$ and $P_{x4}$ may be thereby well applied with the desired plate voltage signal (e.g., Vcom) by way of the signal delivering wiring complex.

According to above explanation, a total resistance of the signal wiring is minimized by using the longitudinal storage lines STL21, STL22 and STL23 connected the first to the fourth common voltage wirings BL1, BL2, BL3 and BL4 is the entire display panel 501, so that a ripple in the delivered plate voltage signal (e.g., Vcom) may be decreased.

Particularly, in a structure in which two pixels are disposed between (sandwiched between) the neighboring data lines $DL_{k-1}$, $DL_k$ and $DL_{k+1}$, the longitudinal storage lines STL21, STL22 and STL23 are disposed between the pixel units $P_{x1}$, $P_{x2}$, $P_{x3}$ and $P_{x4}$, so that a decline of an aperture ratio of the display area DA may be minimized.

Also, the longitudinal storage lines STL21, STL22 and STL23 are formed, so that an extent of the first to the fourth common voltage wirings BL1, BL2, BL3 and BL4, particularly the third and fourth common voltage wirings, in the periphery area PA may be decreased or omitted. Accordingly, since an optimal extent of the periphery area PA may be minimized, eventually an extent of the display area DA is relatively increased with respect to an extent of the periphery area PA, so that an effective display extent ratio (DA/(DA+PA)) in a display panel of same size may be maximized.

Figure 6A:
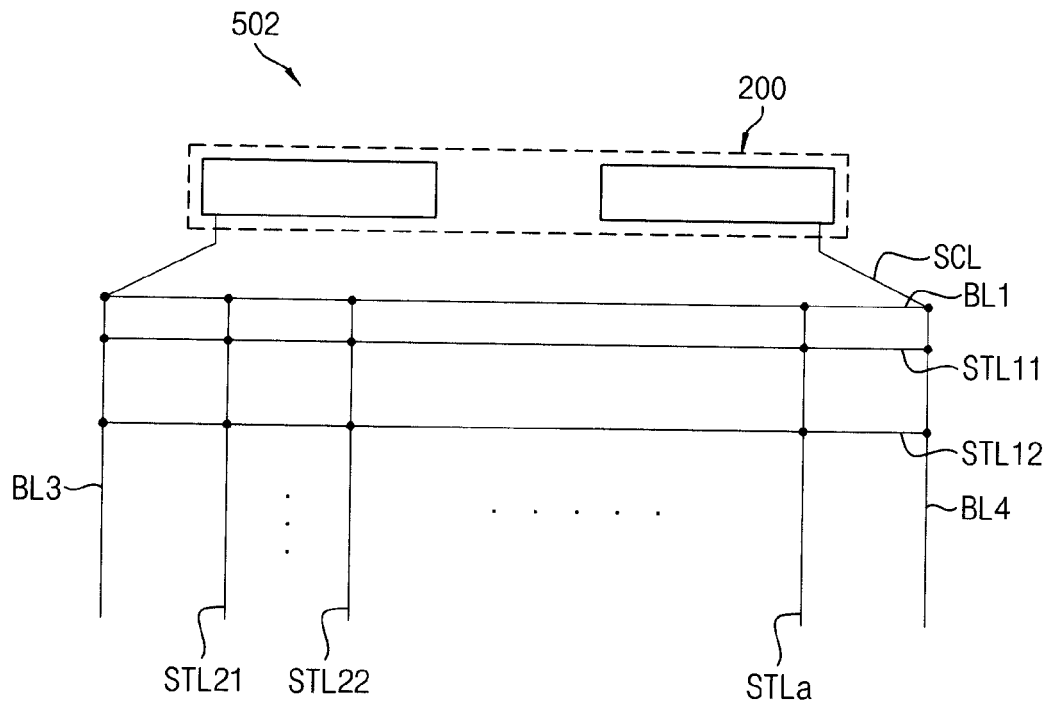
FIGS. 6A and 6B are top plan views illustrating a connection relationship between a common voltage wiring, a transverse storage line and a longitudinal storage line in a display panel according to another exemplary embodiment of the present disclosure.
Figure 6B:
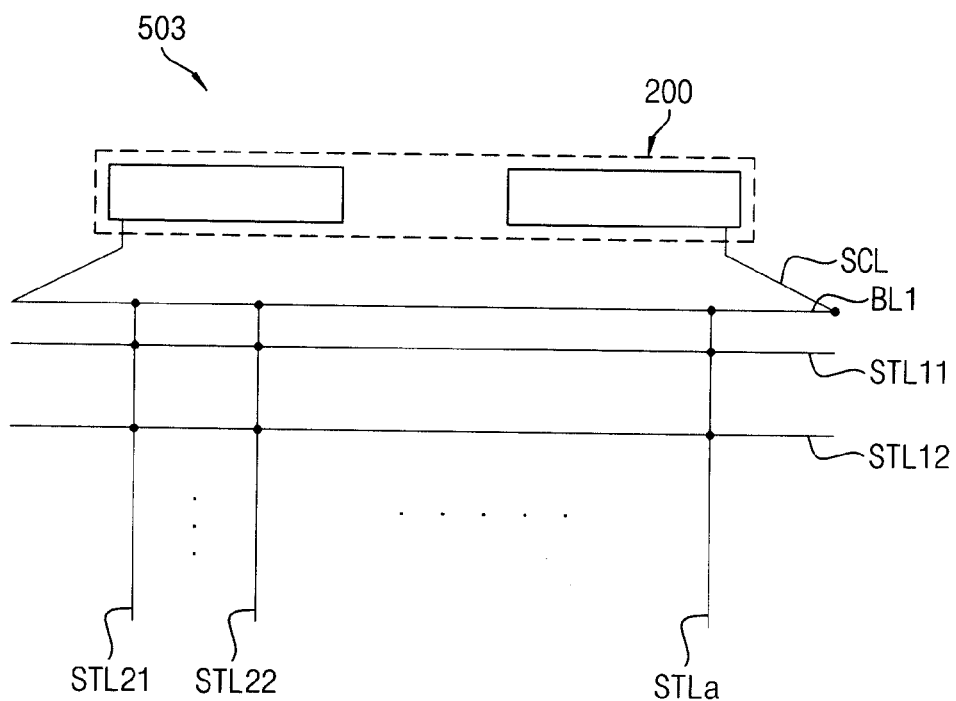

FIGS. 6A and 6B are plan views illustrating a connection relationship between a common voltage wiring, a transverse storage line and a longitudinal storage line in a display panel according to another exemplary embodiment of the present disclosure.

In FIGS. 6A and 6B, a reference numeral "$STL_a$" represents a last longitudinal storage line disposed at an opposite side of a display panel having the first longitudinal storage line STL21 at a first side. Also, components in FIGS. 6A and 6B are substantially same as in FIGS. 2A and 2B other than the configuration of the common voltage wirings (BL's). Therefore, repetitive components are omitted and different components will be explained with reference to FIGS. 6A and 6B.

Referring to FIGS. 6A and 1, a display panel 502 includes longitudinal storage lines STL21, STL22, . . . and $STL_a$, transverse storage lines STL11 and STL12, a first common voltage wiring BL1, a third common voltage wiring BL3, and a fourth common voltage wiring BL4.

The first common voltage wiring BL1 of this embodiment is extended along a first direction DN1 of the display panel 502, so that the first common voltage wiring BL1 is connected to first ends of the longitudinal storage lines STL21, STL22, . . . and $STL_a$. The first common voltage wiring BL1 may be connected to a data driving part 200 through a storage connection wiring SCL. The first common voltage wiring BL1 may be formed from the same layer as that of the gate lines $GL_{m-1}$, $GL_m$, $GL_{m+1}$ and $GL_{m+2}$.

The third common voltage wiring BL3 is connected to the first common voltage wiring BL1, so that the third common voltage wiring BL3 is disposed adjacent to the first longitudinal storage lines STL21. The third common voltage wiring BL3 is extended along a second direction DN2 of the display panel 502. Also, the third common voltage wiring BL3 is connected to first ends of the transverse storage lines STL11 and STL12. The third common voltage wiring BL3 may be formed from the same layer as that of data lines $DL_{k-1}$, $DL_k$ and $DL_{k+1}$.

The fourth common voltage wiring BL4 is connected to the first common voltage wiring BL1, so that the fourth common voltage wiring BL4 is disposed adjacent to the last longitudinal storage lines STLa. The fourth common voltage wiring BL4 is extended along a second direction DN2 of the display panel 502, so that the fourth common voltage wiring BL4 is connected to another ends of the transverse storage lines STL11 and STL12. The fourth common voltage wiring BL4 may be formed from the same layer as that of the third common voltage wiring BL3.

According to above described embodiment, the plate voltage signal (e.g., Vcom) is applied to the longitudinal storage lines STL21, STL22, . . . and $STL_a$ by only the first, the third and fourth common voltage wirings BL1, BL3 and BL4 without use of the second common voltage wiring BL2 shown in FIG. 1. And the common voltage signal (e.g., Vcom) is applied to the transverse storage lines STL11 and STL12. Therefore, since a wiring resistance applying the common voltage may be minimized in the entire display panel, a ripple may be decreased. Accordingly, a decline of display quality by a cross-talk and a flicker may be prevented.

Referring to FIGS. 1 and 6B, a display panel 503 includes a first common voltage wiring BL1, transverse storage lines STL11 and STL12 and longitudinal storage lines STL21, STL22, . . . and $STL_a$. The first common voltage wiring BL1 is extended along a first direction of the display panel 503 and is connected to first ends of the longitudinal storage lines STL21, STL22, . . . and $STL_a$. The first common voltage wiring BL1 may be connected to a data driving part 200 through a storage connection wiring SCL. The first common voltage wiring BL1 may be formed from the same layer as the gate lines $GL_{m-1}$, $GL_m$, $GL_{m+1}$ and $GL_{m+2}$.

According to above described, the common voltage is applied to the longitudinal storage lines STL21, STL22, . . . and $STL_a$ by only the first common voltage wiring BL1 without use of the second to the fourth common voltage wiring BL2, BL3 and BL4 shown in FIG. 1 and is applied to the transverse storage lines STL11 and STL12 connected to the longitudinal storage lines STL21, STL22, . . . and $STL_a$. Therefore, since a wiring resistance applying the common voltage may be minimized in the entire display panel 502, a ripple may be decreased. Accordingly, a decline of display quality by a cross-talk and a flicker may be prevented.

Figure 7:
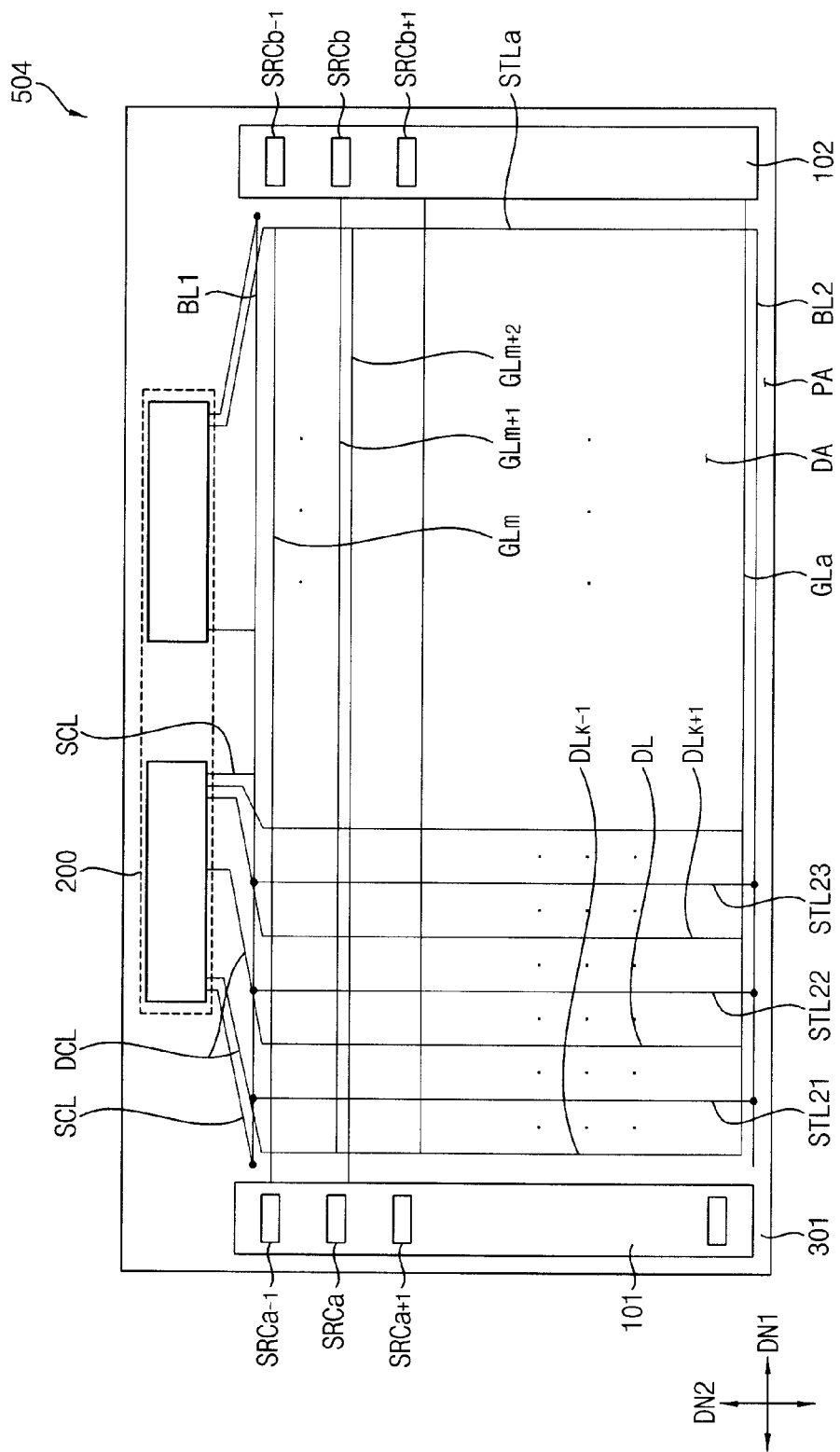
FIG. 7 is a plan view illustrating a display panel according to another exemplary embodiment of the present disclosure.
Figure 8:
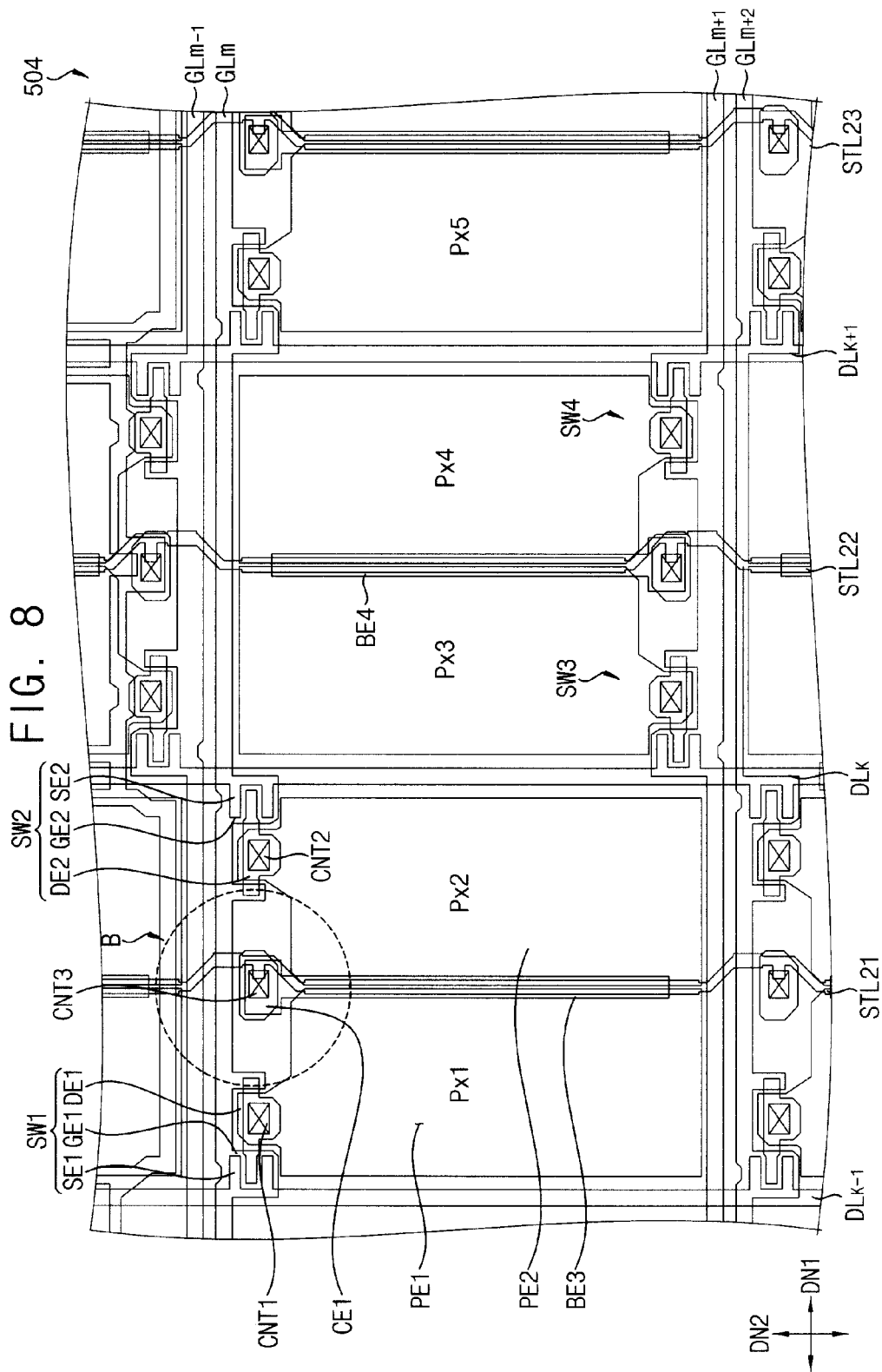
FIG. 8 is a plan view illustrating a pixel structure of a display area of FIG. 7.

FIG. 7 is a plan view illustrating a display panel according to another exemplary embodiment of the present disclosure. FIG. 8 is a plan view illustrating a pixel structure of a display area of FIG. 7.

A display panel 504 shown in FIGS. 7 and 8 is substantially the same as the display panel 501 shown in FIGS. 1 and 2A other than that transverse storage lines STL11, STL12, STL13 and STL14 shown in FIG. 2A are omitted in FIGS. 7 and 8 and the light blocking electrodes BE3 and BE4 are connected to longitudinal storage lines STL21, STL22 and STL23. Therefore, repetitive explanations will be omitted.

Referring to FIGS. 7 and 8, a display panel 504 includes a display substrate 301 having a first gate driving part 101 and a second gate driving part 101 and a data driving part 200 disposed on the display substrate 301.

The display substrate 301 includes a plurality of gate lines $GL_{m-1}$, $GL_m$, $GL_{m+1}$ and $GL_{m+2}$, herein 'm' is a natural number more than 2, a plurality of data lines $DL_{k-1}$, $DL_k$ and $DL_{k+1}$, herein 'k' is a natural number more than 2, longitudinal storage lines STL21, STL22, . . . and $STL_a$ and light blocking electrodes BE3 and BE4. The display substrate 301 further includes respective first and second common voltage wirings, BL1 and BL2. The first and second common voltage wirings BL1 and BL2 are electrically connected to the longitudinal storage lines STL21, STL22, . . . and $STL_a$ and to the light blocking electrodes BE3 and BE4.

A first pixel unit $P_{x1}$ of the display panel 502 includes a first switching element SE1 and a first pixel electrode PE1 connected to the first switching element SE1 in a first contact part CNT1. The first switching element SE1 is connected to a m-th gate line $GL_m$ and a k-1-th data line $DL_{k-1}$. A second pixel $P_{x2}$ disposed in a first direction DN1 of the first pixel unit $P_{x1}$ includes a second switching element SW2 and a second pixel electrode PE2 connected to the second switching element SW2 in a second contact part CNT2. The second switching element SW2 is connected to the m-th gate line $GL_m$ and a k-th data line $DL_k$.

The longitudinal storage lines STL21, STL22, . . . and $STL_a$ are extended in a second direction DN2 different from the first direction DN1 and cross the gate lines $GL_{m-1}$, $GL_m$, $GL_{m+1}$ and $GL_{m+2}$. Simultaneously, the longitudinal storage lines STL21, STL22, . . . and $STL_a$ are connected to the light blocking electrodes, BE3 and BE4 by contacting with them. Each of the longitudinal storage lines STL21, STL22, . . . and $STL_a$ are disposed between neighboring data lines $DL_{k-1}$, $DL_k$ and $DL_{k+1}$.

For example, a first longitudinal storage line STL21 is disposed between the k-1-th data line $DL_{k-1}$ and the k-1-th data line $DL_k$. Accordingly, the first pixel unit $P_{x1}$ is disposed between the k-1-th data line $DL_{k-1}$ and the first longitudinal storage line STL21. Simultaneously, the second pixel unit $P_{x2}$ is disposed between the k-th data line $DL_k$ and the first longitudinal storage line STL21. A second longitudinal storage line STL22 disposed in the first direction DN1 of the first longitudinal storage line STL21 is disposed between the k-th data line $DL_k$ and the k+1-th data line $DL_{k+1}$.

A third light blocking electrode BE3 is disposed below the first longitudinal storage line STL21 and overlapped with the first longitudinal storage line STL21. In this embodiment, the first longitudinal storage line STL21 is contacted with the third light blocking electrode BE3. The first longitudinal storage line STL21 is connected to the third light blocking electrode BE3 by contacting through the first contact electrode CE1 in a third contact part CNT3.

Also, a fourth light blocking electrode BE4 is disposed below the second longitudinal storage line STL22 and overlapped with the second longitudinal storage line STL22. The second longitudinal storage line STL22 is contacted with the fourth light blocking electrode BE4. The second longitudinal storage line STL22 is connected to the fourth light blocking electrode BE4 by contacting through the second contact electrode CE2 in a fourth contact part CNT4.

Figure 9:
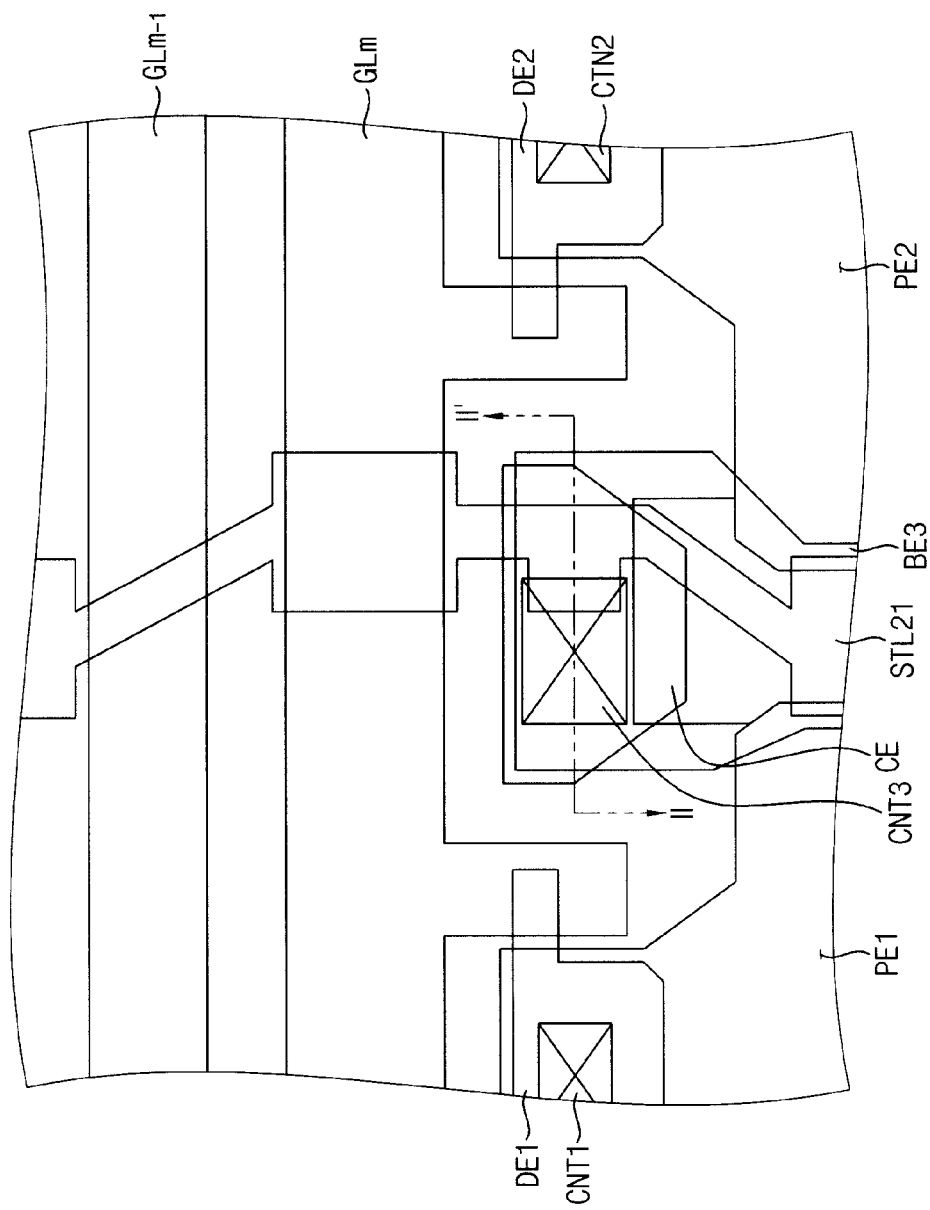
FIG. 9 is an enlarged plan view illustrating a portion B of FIG. 8.

Hereinafter, a connection relationship between the longitudinal storage lines STL21, STL22, . . . and $STL_a$ and the first and second contact electrodes CE3 and CE4 in the third and fourth contact parts CNT3 and CNT4 will be explained with reference to FIG. 9. In FIG. 9, for example, a connection between the first longitudinal storage line STL21 and the first contact electrode CE1 is representatively explained.

FIG. 9 is an enlarged plan view illustrating a portion B of FIG. 8.

Referring to FIG. 9, the third contact part CNT3 is defined in an area at one end where the third light blocking electrode BE3 crosses the first longitudinal storage line STL21. The third light blocking electrode BE3 and the first longitudinal storage line STL21 may be simultaneously exposed by an opening through the insulation layer 320 and the passivation layer 340 of FIG. 3B. The third light blocking electrode BE3 is formed with an island type shape and below the first longitudinal storage line STL21. However the third light blocking electrode BE3 of this embodiment is connected to the first longitudinal storage line STL21 by the first contact electrode CE1 extending in the third contact part CNT3.

The longitudinal storage lines STL21, STL22, . . . and STL$_a$ connected to the first and second common voltage wirings BL1 and BL2 are formed on the display area DA, the third and fourth common voltage wirings BL3 and BL4 and the transverse storage lines STL11 and STL12 shown in FIGS. 3 and 4 may be omitted in this embodiment. Although did not shown in the drawings, the display panel 504 may further include the third and fourth common voltage wirings BL3 and BL4. At this time, a wiring width of each of the third and fourth common voltage wirings BL3 and BL4 may be more decreased than when the third and fourth common voltage wirings BL3 and BL4 are not included in addition to the longitudinal storage lines STL21, STL22, . . . and STL$_a$. Therefore, an extent occupied by the third and fourth common voltage wirings BL3 and BL4 in the display panel 504 may be decreased.

Also, since a total resistance of signal wirings applying the common voltage signal through the longitudinal storage lines STL21, STL22, . . . and STL$_a$ may be minimized in the entire display panel 504, a ripple may be decreased. Therefore, a decline of display quality by a cross-talk and a flicker may be prevented.

Figure 10A:
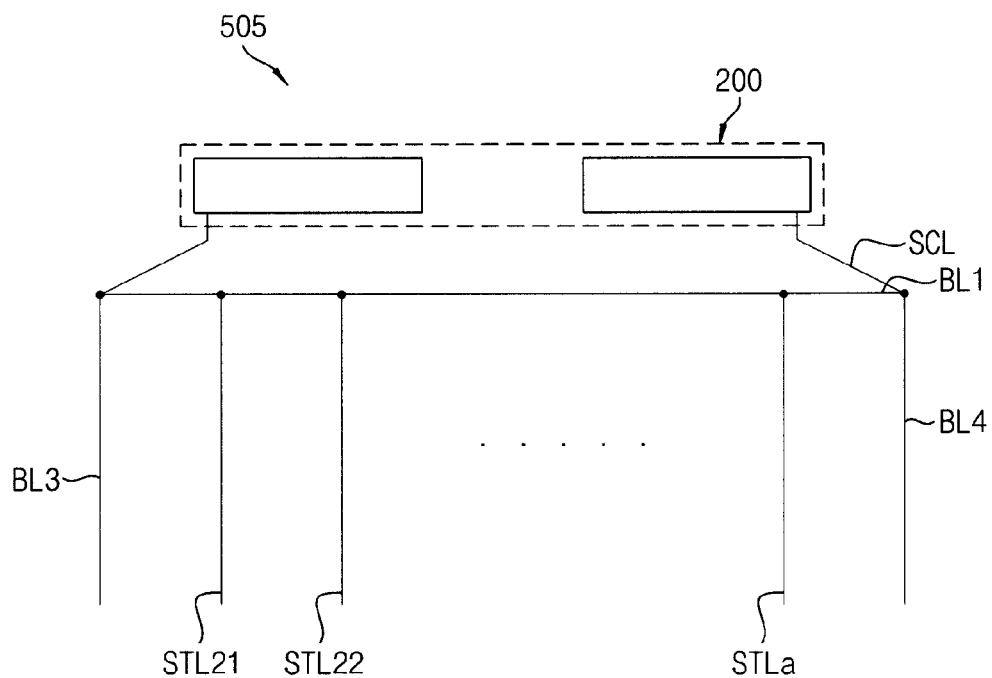
FIGS. 10A and 10B are plan views illustrating a connection relationship between a common voltage wiring and a longitudinal storage line in a display panel according to another exemplary embodiment of the present disclosure.
Figure 10B:
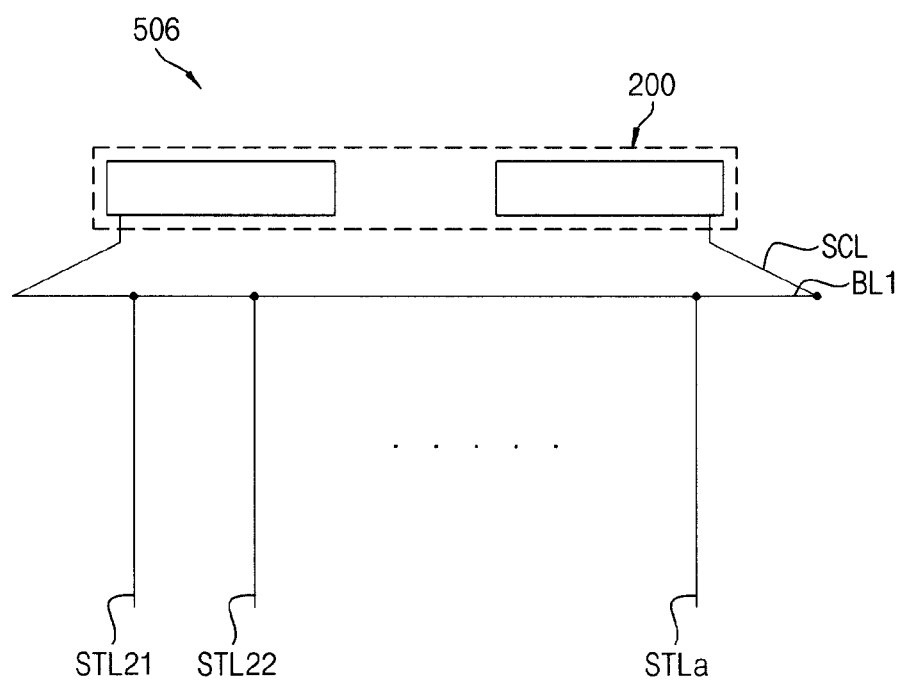

FIGS. 10A and 10B are plan views illustrating a connection relationship between a common voltage wiring and a longitudinal storage line in a display panel according to another exemplary embodiment.

In FIGS. 10A and 10B, a reference numeral "STL$_a$" represents a last longitudinal storage line disposed opposite of the display panel having the first longitudinal storage line STL21 among the longitudinal storage lines. Also, components in FIGS. 10A and 10B are substantially same as in FIGS. 7 and 8 other than common voltage wirings. Therefore, repetitive components will be omitted and different components will be explained with reference to FIGS. 7, 8, 10A and 10B.

Referring to FIGS. 10A and 7, a display panel 505 includes longitudinal storage lines STL21, STL22, . . . and STL$_a$, a first common voltage wiring BL1, a third common voltage wiring BL3 and a fourth common voltage wiring BL4 but not the second common voltage wiring BL2.

The first common voltage wiring BL1 is extended along a first direction DN1 of the display panel 502 and connected to one ends of the longitudinal storage lines STL21, STL22, . . . and STL$_a$. The first common voltage wiring BL1 may be connected to a data driving part 200 through a storage connection wiring SCL. The first common voltage wiring BL1 may be formed from the same layer as gate lines GL$_{m-1}$, GL$_m$, GL$_{m+1}$ and GL$_{m+2}$.

The third common voltage wiring BL3 is connected to the first common voltage wiring BL1 and disposed adjacent to the first longitudinal storage line STL21. The third common voltage wiring BL3 is extended along a second direction DN2 of the display panel 502. The third common voltage wiring BL3 may be formed from the same layer as data lines DL$_{k-1}$, DL$_k$ and DL$_{k+1}$.

The fourth common voltage wiring BL4 is connected to the first common voltage wiring BL1 and disposed adjacent to the last longitudinal storage line STLa. The fourth common voltage wiring BL4 is extended along a second direction DN2 of the display panel 502. The fourth common voltage wiring BL4 may be formed from the same layer as the third common voltage wiring BL3.

According to above described embodiment, the common voltage signal is applied to the longitudinal storage lines STL21, STL22, . . . and STL$_a$ by only the first, the third and fourth common voltage wirings BL1, BL3 and BL4 and the common voltage is applied to the transverse storage lines STL11 and STL12 connected to the longitudinal storage lines STL21, STL22, . . . and STL$_a$, so that a total resistance of signal wirings applying the common voltage signal may be minimized. Accordingly a ripple may be decreased and a decline of display quality by a cross-talk and a flicker may be prevented.

Referring to FIGS. 10B and 7, a display panel 506 includes a first common voltage wiring BL1 and longitudinal storage lines STL21, STL22, . . . and STL$_a$. The first common voltage wiring BL1 is extended along a first direction DN1 of the display panel 502 and connected to one ends of the longitudinal storage lines STL21, STL22, . . . and STL$_a$. The first common voltage wiring BL1 may be connected to a data driving part 200 through a storage connection wiring SCL. The first common voltage wiring BL1 may be formed from the same layer as the gate lines GL$_{m-1}$, GL$_m$, GL$_{m+1}$, GL$_{m+2}$. According to above described, the common voltage is applied to the longitudinal storage lines STL21, STL22, . . . and STL$_a$ by only the first common voltage wiring BL1 without using the longitudinal storage lines STL21, STL22, . . . and STL$_a$, so that a total resistance of signal wiring applying the common voltage may be minimized in the entire display panel 506.

Figure 11:
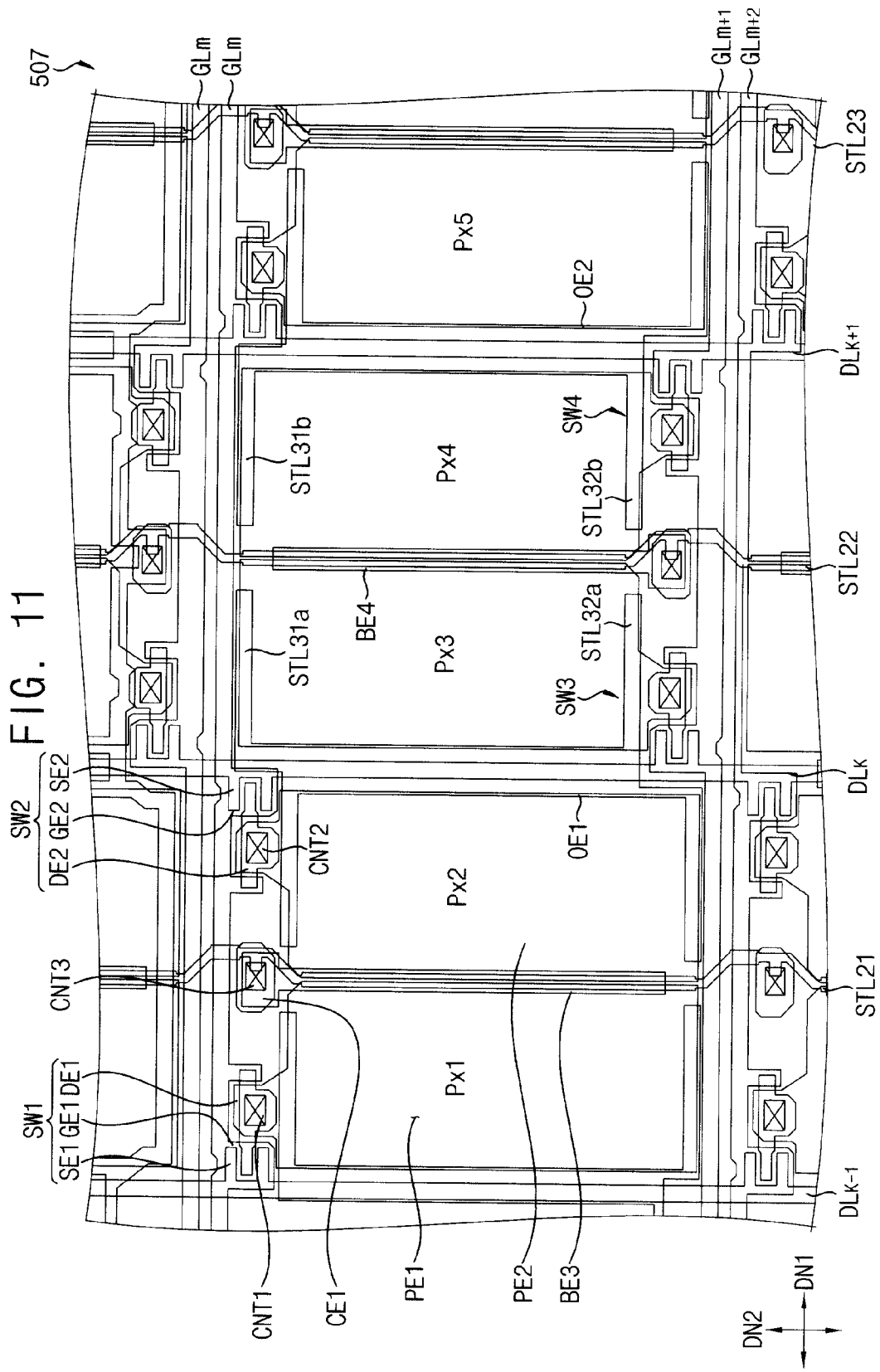
FIG. 11 is a plan view illustrating a pixel structure of a display area in a display panel according to another exemplary embodiment of the present disclosure.

FIG. 11 is a plan view illustrating a pixel structure of a display area in a display panel according to another exemplary embodiment.

The display panel 507 shown in FIG. 11 is substantially same as the display panel 504 described in FIG. 8 other than the provision of the transverse storage lines STL31a, STL31b, STL32a and STL32b and the provision of the overlapped electrodes OE1 and OE2 included in this embodiment. Therefore, repetitive components are omitted.

Referring to FIG. 11, transverse storage lines STL31a, STL31b, STL32a and STL32b of the display panel 507 are extended to a first direction DN1 along gate lines GL$_{m-1}$, GL$_m$, GL$_{m+1}$ and GL$_{m+2}$, herein 'm' is a natural number more than 2, and disposed adjacent to both ends in a second direction DN2 of the along gate lines GL$_{m-1}$, GL$_m$, GL$_{m+1}$ and GL$_{m+2}$. A transverse storage line STL31a and STL31b adjacent to m-th gate line GL$_m$ includes a third storage pattern STL32a and a fourth storage pattern STL32b disposed in the first direction DN1 neighboring each other.

The first and third storage patterns STL31a and STL32a are crossed with k-th data line DL$_k$. Also, the first and third storage patterns STL31a and STL32a are disposed between a third light blocking electrode BE3 and a fourth blocking electrode BE4 neighboring each other. That is, the first and third storage patterns STL31a and STL32a may be physically and electrically separated with the third and fourth light blocking electrodes BE3 and BE4 and the longitudinal storage lines STL21, STL22 and STL23. Also, the second and fourth storage patterns STL31b and STL32b are crossed with k+1-th data line DL$_{k+1}$. A fourth light blocking electrode BE4 is disposed between the first and second storage patterns STL31a and STL31b. The fourth light blocking electrode BE4 is disposed between the third and fourth storage patterns STL32a and STL32b.

With regard to the overlapped electrodes OE1 and OE2, the first overlapped electrode OE1 is extended in the second direction DN2 and overlapped with the k-th data line DL$_k$ and connects the first and third storage patterns STL31a and STL32a. Accordingly, the first overlapped electrode OE1, the first and third storage patterns STL31a and STL32a may define one floating electrode. Also, the second overlapped electrode OE2 is disposed in the first direction DN1 of the first overlapped electrode OE1 and is extended in the second direction DN2 and overlapped with the k+1-th data line $DL_{k+1}$ and connects the second and fourth storage patterns STL31b and STL32b. Accordingly, the second overlapped electrode OE2, the second and fourth storage patterns STL31b and STL32b may define another floating electrode.

Accordingly, the first and second overlapped electrodes OE1 an OE2 may be physically and electrically separated with the third and fourth light blocking electrodes BE3 and BE4 and the longitudinal storage lines STL21, STL22 and STL23.

Figure 12:
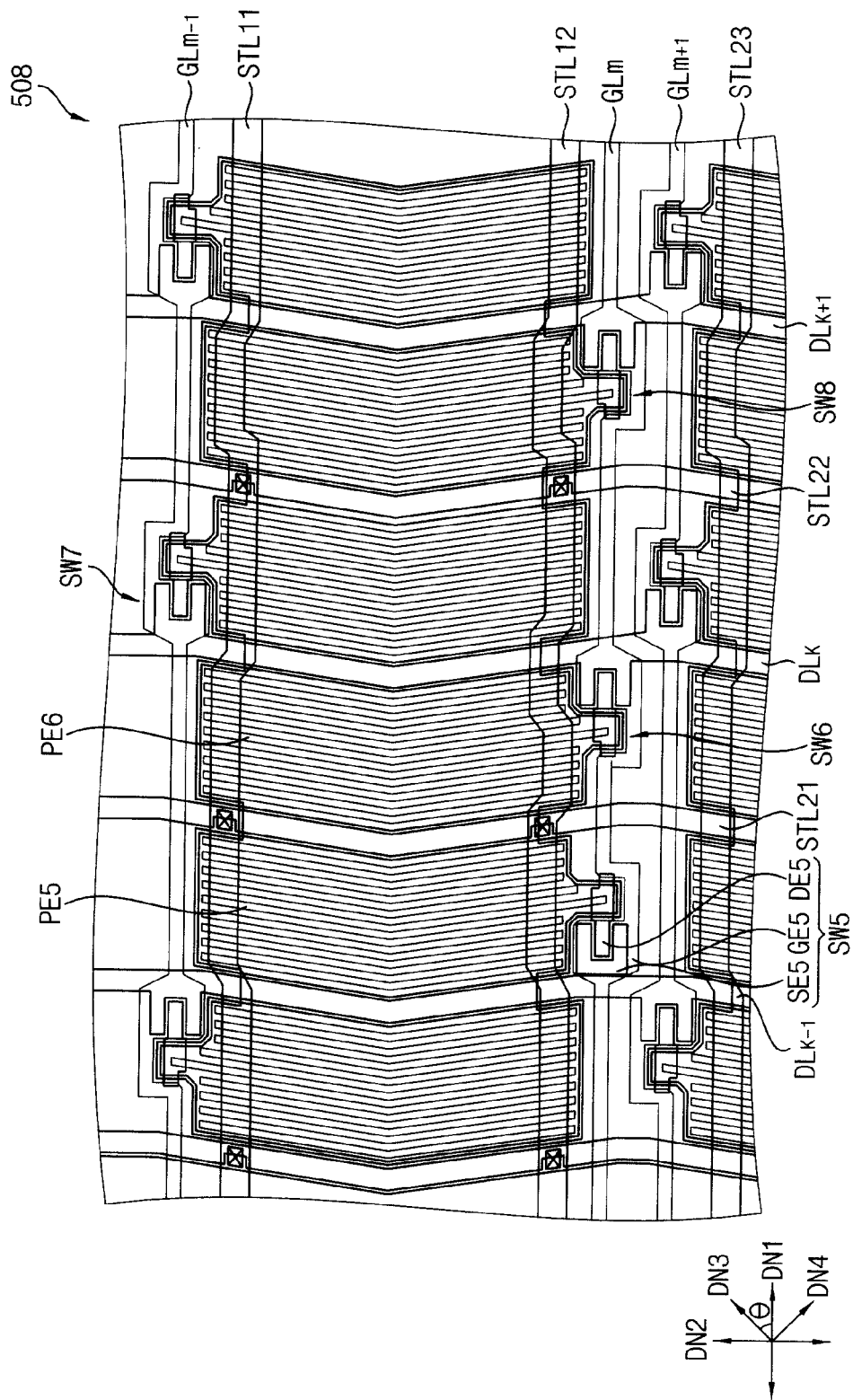
FIG. 12 is a plan view illustrating a display panel according to another exemplary embodiment of the present disclosure.
Figure 13:
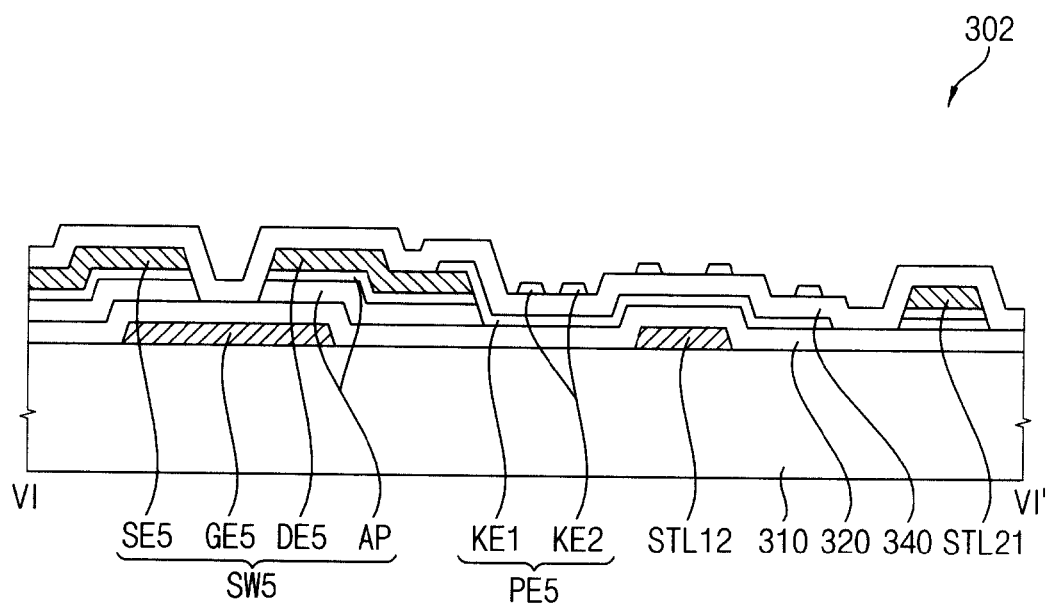
FIG. 13 is a cross-sectional view cutting along a line VI-VI' of FIG. 12.

FIG. 12 is a plan view illustrating a display panel according to another exemplary embodiment. FIG. 13 is a cross-sectional view cutting along a line VI-VI' of FIG. 12.

Referring to FIG. 12, a display panel 503 includes a plurality of gate lines $GL_{m-1}$, $GL_m$, $GL_{m+1}$ and $GL_{m+2}$, herein 'm' is a natural number more than 2, a plurality of data lines $DL_{k-1}$, $DL_k$, $DL_{k+1}$, herein 'm' is a natural number more than 2, transverse storage lines STL11, STL12 and STL13 and longitudinal storage lines STL21, STL22 and STL23.

The gate lines $GL_{m-1}$, $GL_m$, $GL_{m+1}$ and $GL_{m+2}$ are extended in a first direction DN1 and the data lines $DL_{k-1}$, $DL_k$, $DL_{k+1}$ are extended in a second direction DN2 different from the first direction DN1. The second direction DN2 may be vertical to the first direction DN1. For example, each of the data lines $DL_{k-1}$, $DL_k$, $DL_{k+1}$ includes a first extending part and a second extending part. The first extending part is extended in a third direction DN3 between the first direction DN1 and the second direction DN2. The second extending part is connected to the first extending part and extended in a fourth direction DN4 between the first direction DN1 and the second direction DN2. The first extending part is inclined by an angle of predetermined degree θ with respect to the first direction DN1. The angle θ may be about 75° degree. The second extending part may be inclined by an angle of about 150° with respect to the third direction DN3. That is, when the extending part is inclined by an angle of about +75° with respect to the first direction DN1, the extending part is inclined by an angle of about −75° with respect to the first direction DN1. Although the extending directions of the first and second extending parts are different from the second direction DN2, the first and second extending parts are repeated, so that the first and second extending parts are substantially extended in the second direction DN2.

A first pixel of the display panel 503 includes a first switching element SW5 and a first pixel electrode PE5. The first pixel electrode PE5 includes a first sub electrode KE1 and a second sub electrode KE2. The first sub electrode KE1 applies a pixel voltage to the first pixel. The second sub electrode KE2 is overlapped with the first sub electrode KE1. The first sub electrode KE1 is formed on the whole first pixel and the second sub electrode KE2 includes a plurality of slitted electrodes. A phased switching between the first sub electrode KE1 and the second sub electrode KE2 controls a display element to have different subpixel voltages, for example liquid crystal orientations are different about the respective first and second subpixels, thus a more visible image is displayed on the display panel 503.

The first switching element SW5 is connected to a m-th gate line $GL_m$, a k−1-th data line $DL_{k-1}$ and the first pixel electrode PE5. For example, the first switching element SW5 includes a first gate electrode GE5 connected to the m-th gate line $GL_m$, a first source electrode SE5 connected to the k−1-th data line $DL_{k-1}$ and a first drain electrode DE5 spaced from the first source electrode SE5. The first drain electrode DE5 is contacted with the first sub electrode KE1, so that the first switching element SW5 is electrically connected to the first pixel electrode PE5.

A second pixel is disposed in the first direction DN1 on the first pixel and includes a second switching element SW6 and a second pixel electrode PE6. The second switching element SW6 is connected to the m-th gate line $GL_m$ and a k-th data line $DL_k$. a relationship between the second switching element SW6 and the second pixel electrode PE6 is substantially same as a relationship between the first switching element SW5 and the first pixel electrode PE5. Therefore, repetitive explanations will be omitted.

A third pixel disposed in the first direction DN1 of the second pixel includes a m+1-th gate line $GL_{m+1}$ and a third switching element SW7 connected to the k-th data line $DL_k$. A fourth pixel disposed in the first direction DN1 of the third pixel includes the m-th gate line $GL_1$ and a fourth switching element SW8 connected to the k+1-th data line $DL_{k+1}$.

The second pixel electrode PE6 of the second pixel unit and each of pixel electrodes formed on the third and the fourth pixel units may include a respective sub electrode and a second sub electrode. The first sub electrode applies a pixel voltage with substantially same magnitude as the first pixel electrode PE1. The second sub electrode applies a pixel voltage which is exceeded by that of the first sub electrode. The second sub electrode KE2 of the first pixel electrode PE5 may be integrally connected to one of second sub electrodes of the second to the fourth sub electrodes.

The transverse storage lines STL11, STL12 and STL13 are extended in the first direction DN1 and two transverse storage lines STL11, STL12 and STL13 are disposed between neighboring two gate lines $GL_{m-1}$, $GL_m$, $GL_{m+1}$. For example, the first transverse storage lines STL11 and the second transverse storage lines STL12 may be disposed between the m−1-th and the m-th gate lines $GL_{m-1}$ and $GL_m$. The transverse storage lines STL11, STL12 and STL13 are formed from the same layer as the gate lines $GL_{m-1}$, $GL_m$, $GL_{m+1}$. The data lines $DL_{k-1}$, $DL_k$ and $DL_{k+1}$ may be crossed with the gate lines $GL_{m-1}$, $GL_m$, $GL_{m+1}$ and the transverse storage lines STL11, STL12 and STL13 and may be insulated by gate insulation layer 320.

The longitudinal storage lines STL21, STL22 and STL23 are extended in the second direction DN2. The longitudinal storage lines STL21, STL22 and STL23 have a shape substantially same as the bent one of the data lines $DL_{k-1}$, $DL_k$ and $DL_{k+1}$ and may include a first extending part extended in the third direction DN3 and a second extending part extended in the fourth direction DN4. The longitudinal storage lines STL21, STL22 and STL23 are crossed with the gate lines $GL_{m-1}$, $GL_m$, $GL_{m+1}$ and partially contacted with the transverse storage lines STL11, STL12 and STL13.

Figure 14:
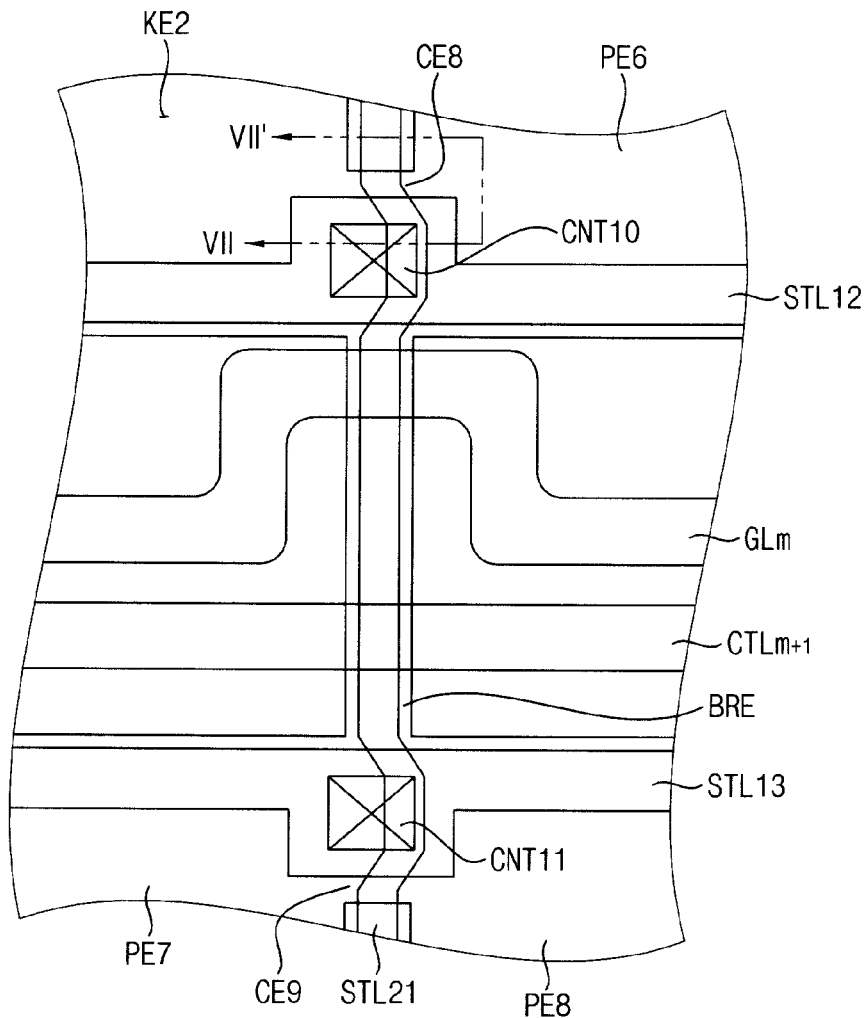
FIG. 14 is a plan view illustrating a connection relationship of a longitudinal storage line of FIG. 13.
Figure 15:
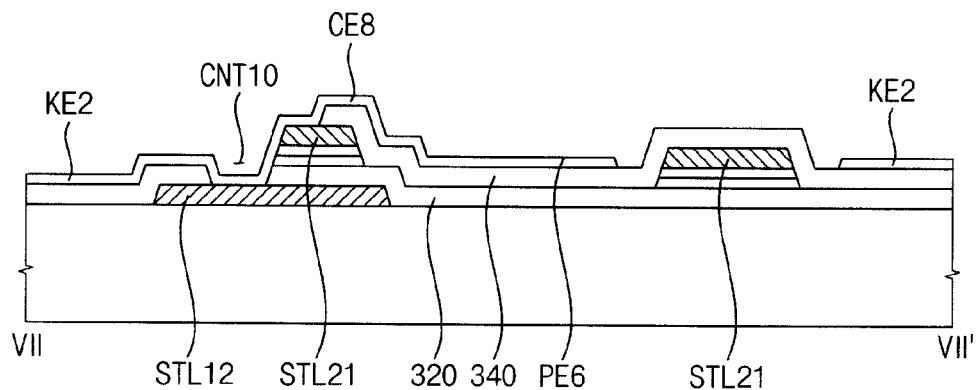
FIG. 15 is a cross-sectional view cutting along a line VII-VII' of FIG. 14.

FIG. 14 is a plan view illustrating a connection relationship of a longitudinal storage line of FIG. 13. FIG. 15 is a cross-sectional view cutting along a line VII-VII' of FIG. 14.

Referring to FIGS. 14 and 15, the first longitudinal storage line STL21 may be connected to the second transverse storage line STL12 through an eighth contact electrode CE8 in a tenth contact part CNT10. The eighth contact electrode CE8 connects the second sub electrode KE2 of the first pixel electrode PE5 and the second sub electrode KE2 of the second pixel electrode PE6. The eighth contact electrode CE8 is formed with a electrode layer the same as that of the second sub electrode KE2 of the first pixel electrode PE5. The tenth contact part CNT10 is portion area of the first longitudinal storage line STL21 exposed by the gate insulation layer 320 and the passivation layer 340 and the second transverse storage line STL12.

In the tenth contact part CNT10, first longitudinal storage line STL21 and the second transverse storage line STL12 are connected each other. At the same time, the first longitudinal storage line STL21 and the second transverse storage line STL12 may be connected to the second sub electrodes of the pixel electrodes PE5, PE6, PE7 and PE8.

The first and second pixel electrodes PE5 and PE6 and pixel electrodes PE7 and PE8 are connected to each other through a bridge electrode BRE. The bridge electrode BRE may be overlapped with the first longitudinal storage line STL21. A ninth contact electrode CE9 connecting pixel electrodes PE7 and PE8 disposed in the second direction DN2 of the first and second pixel electrodes PE5 and PE6 is disposed on both ends of the bridge electrode BRE. The bridge electrode BRE is connected to the eighth and ninth contact electrodes CE8 and CE9.

According to above described, in the whole display panel 503, a network for applying and propagating the plate voltage signal (e.g., Vcom) is formed by connecting the transverse storage lines STL11, STL12, STL13 and STL14 and the longitudinal storage lines STL21, STL22 and STL23. Although respective shorts are occurred in only those contact parts among a plurality of contact parts in which the transverse storage lines STL11, STL12, STL13 and STL14 and longitudinal storage lines STL21, STL22 and STL23 are connected to each other, since the network is integrally connected, the common voltage signal may be stably applied to all the pixels.

Also, a total resistance of the signal wiring is minimized by using the longitudinal storage lines STL21, STL22 and STL23, so that a ripple may be decreased. Accordingly, a decline of display quality by a cross-talk and a flicker may be prevented. Particularly, in a structure in which two pixels are disposed between the neighboring data lines $DL_{k-1}$, $DL_k$ and $DL_{k+1}$, the longitudinal storage lines STL21, STL22 and STL23 are disposed between the pixels $P_{x1}$, $P_{x2}$, $P_{x3}$ and $P_{x4}$, so that a decline of an aperture ratio of the display panel 503 may be minimized.

According to above described, a common voltage signal may be sent to the each pixel through a plurality of the longitudinal storage lines. A plurality of the longitudinal storage lines are extended in a direction substantially same as an extending direction of a data lines to dispose between pixels of a display area. Therefore, since a wiring resistance applying the common voltage may be minimized in the entire display substrate, a ripple may be decreased. Therefore, a decline of display quality by a cross-talk and a flicker may be prevented. Particularly, a decline of an aperture of the display area may be minimized through the longitudinal storage lines is disposed between pixels in a structure disposed with two pixels between adjacent data lines.

Also, the longitudinal storage lines are formed, so that an extent occupied by a common voltage wiring applying the common voltage to the each longitudinal storage line in a periphery area of the display area may be decreased or omitted. Therefore, an optimal extent of the periphery area may be minimized, so that eventually an effective display extent may be maximized in a same size display panel through the display extent is relatively increased with respect to an extent of the periphery area.

Although a few exemplary embodiments of the present disclosure of invention have been described, those skilled in the art will readily appreciate in light of the foregoing that many modifications are possible in the example embodiments without materially departing from the novel teachings and advantages disclosed herein.

What is claimed is:

1. A display substrate comprising:
   a plurality of gate lines extended along a first direction and on a base substrate;
   a plurality of data lines extended in a second direction and crossing with the gate lines;
   a plurality of transverse storage lines extended in the first direction and crossing with the data lines;
   a plurality of longitudinal storage lines extended in the second direction and crossing with the transverse storage lines,
   wherein at least a first of the transverse storage lines has an exposed portion partially exposing the first transverse storage line such that the first transverse storage line can be contacted at its exposed portion; and
   a contact electrode covering and making contact with the exposed portion of the first transverse storage line, the contact electrode further making contact with a crossing-by first of the longitudinal storage lines.

2. The display substrate of claim 1, wherein a sidewall surface of the first longitudinal storage line is exposed in a first contact part area where the first of the transverse storage lines has an exposed portion, and wherein the contact electrode contacts with a top surface of the first transverse and first longitudinal storage lines and the sidewall surface of the first longitudinal storage line.

3. The display substrate of claim 1, further comprising:
   a first insulation layer disposed to provide an insulating function for the first transverse storage line and the first longitudinal storage line, the first insulation layer having a respective opening exposing the first transverse storage line; and
   a second insulation layer partially covering the longitudinal storage line formed on the first insulation layer, the second insulation layer having a respective opening exposing the exposed surface of the transverse storage line exposed by the first insulation layer, and an upper surface and a sidewall surface of the longitudinal storage line, and
   wherein the contact part area is thus formed through the respective openings of the first insulation layer and of the second insulation layer.

4. The display substrate of claim 1,
   wherein the data lines include a second data line disposed sequentially successive to and adjacent to the first data line;
   the display substrate further comprising: a first pixel electrode disposed between the first data line and the second data line and connected to the first data line; and
   a second pixel electrode disposed adjacent to the first pixel electrode between the first data line and the second data line and connected to the second data line, and
   wherein the first longitudinal storage line is disposed between the first data line and the second data line.

5. The display substrate of claim 1, further comprising a first common voltage wiring disposed in a periphery area of a display area in which the gate lines and the data lines are disposed, the first common voltage wiring extending substantially parallel with and alongside the first transverse storage line, the first common voltage wiring being connected to one end of the first longitudinal storage line.

6. The display substrate of claim 5, wherein the first common voltage wiring is disposed in the periphery area between a data driving part and the display area, and the data driving part is configured to transmit a data driving signal to the first data line.

7. The display substrate of claim 5, further comprising a second common voltage wiring connected to another end of the first longitudinal storage line, the second common voltage wiring facing the first common voltage wiring.

8. The display substrate of claim 5, further comprising:
a third common voltage wiring connected to the first common voltage wiring in a periphery area of the display area in which the gate line and the first data line are formed, the third common voltage wiring being extended alongside the first longitudinal storage line, the third common voltage wiring being connected to one end of the transverse storage line; and
a fourth common voltage wiring connected to the first common voltage wiring, the fourth common voltage wiring being extended along the longitudinal storage line, the fourth common voltage wiring being connected to another end of the transverse storage line to face the third common voltage wiring.

9. The display substrate of claim 8, wherein the third common voltage wiring is disposed on the periphery area between a gate driving part and the display area, the gate driving part being configured to transmit a gate driving signal to the gate line.

10. The display substrate of claim 9, wherein:
the first common voltage wiring is formed from the same layer as that of the gate lines and that of the transverse storage lines,
the third and the fourth common voltage wirings are formed from the same layer as that of the first data line and the longitudinal storage line, and
the third and the fourth common voltage wirings are respectively contacted with the first common voltage wiring in an overlapping area between the third common voltage wiring and the first common voltage wiring and in an overlapping area between the fourth common voltage wiring and the first common voltage wiring.

11. The display substrate of claim 1, further comprising a pixel electrode connected to the first gate line and the first data line,
wherein the pixel electrode comprises:
a first sub electrode; and
a second sub electrode formed on the first sub electrode to overlap with the first sub electrode, the second sub electrode including a plurality of slitted electrodes.

12. A display substrate comprising:
a gate line formed in a display area of a base substrate;
a first data line and a second data line extended in a direction crossing the gate line in the display area, the first and second data lines being spaced apart from each other;
a longitudinal storage line disposed and extending between the first and second data lines and crossing the gate line; and
a first common voltage wiring extended alongside the gate line and connected to one end of the longitudinal storage line, the first common voltage wiring being formed in a periphery area of the display area.

13. The display substrate of claim 12, wherein the display substrate further comprises:
a first pixel electrode connected to the first data line and disposed between the first and second data lines; and
a second pixel electrode connected to the second data line and disposed adjacent to the first pixel electrode and also between the first and second data lines.

14. The display substrate of claim 13, further comprising:
a light blocking electrode extending alongside the longitudinal storage line to overlap the longitudinal storage line, the light blocking electrode being disposed in a pixel units separation area between the first and second pixel electrodes, a portion of the light blocking electrode being exposed through a contact part through which the longitudinal storage line is also exposed, the exposed portion of the light blocking electrode corresponding to a crossing area between the light blocking electrode and the longitudinal storage line; and
a contact electrode covering the contact part and making electrical contact with each of the longitudinal storage line and the light blocking electrode.

15. The display substrate of claim 12, further comprising a data driving part, the data driving part being connected to the first and second data lines and being configured to transmit a data driving signal,
wherein the first common voltage wiring is disposed in the periphery area between the data driving part and the display area.

16. The display substrate of claim 12, further comprising a second common voltage wiring connected to another end of the longitudinal storage line, and facing the first common voltage wiring.

17. The display substrate of claim 12, further comprising:
a transverse storage line formed in the display area and crossing the longitudinal storage line, the transverse storage line being contacted with the longitudinal storage line in a crossing area between the transverse storage line and the longitudinal storage line;
a third common voltage wiring connected to the first common voltage wiring in the periphery area, the third common voltage wiring being extended alongside the longitudinal storage line, the third common voltage wiring being connected to one end of the transverse storage line; and
a fourth common voltage wiring connected to the first common voltage wiring, the fourth common voltage wiring extended alongside the longitudinal storage line, the fourth common voltage wiring being connected to another end of the transverse storage line to face the third common voltage wiring.

18. The display substrate of claim 12, further comprising a longitudinal storage line formed in the display area to cross the first and second data lines, the longitudinal storage line being floated from the transverse storage line.

19. A display substrate comprising:
a gate line formed in a display area of a base substrate;
a first data line and a second data line extended in a direction crossing the gate line in the display area, the first and second data lines being spaced apart from each other;
a longitudinal storage line disposed between the first and second data lines and extended in a direction crossing the gate line; and
a transverse storage line extended in a direction crossing the first and second data lines, the transverse storage line being in an electrically floating relation with the longitudinal storage line.

20. The display substrate of claim 19, further comprising:
a light blocking electrode extending along the longitudinal storage line to overlap the longitudinal storage line, a portion of the light blocking electrode being exposed through a contact part through which the longitudinal storage line is partially exposed, the exposed portion of the light blocking electrode being disposed in a crossing region between the light blocking electrode and the horizontal storage line; and a contact electrode covering the contact part and making electrical contact with each of the longitudinal storage line and the light blocking electrode.

\* \* \* \* \*